United States Patent
Vimercati

(10) Patent No.: US 11,837,269 B2
(45) Date of Patent: Dec. 5, 2023

(54) DECK-LEVEL SIGNAL DEVELOPMENT CASCODES

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/462,213

(22) Filed: Aug. 31, 2021

(65) Prior Publication Data
US 2023/0062498 A1  Mar. 2, 2023

(51) Int. Cl.
*G11C 11/22* (2006.01)
*G11C 11/4096* (2006.01)
*G11C 11/4091* (2006.01)

(52) U.S. Cl.
CPC ........ *G11C 11/2273* (2013.01); *G11C 11/221* (2013.01); *G11C 11/2259* (2013.01); *G11C 11/2275* (2013.01); *G11C 11/4091* (2013.01); *G11C 11/4096* (2013.01)

(58) Field of Classification Search
CPC .............. G11C 11/2273; G11C 11/221; G11C 11/2259; G11C 11/2275; G11C 11/4091; G11C 11/4096; G11C 11/2293; G11C 11/2253; G11C 11/2255
USPC .......................................................... 365/149
See application file for complete search history.

(56) References Cited

U.S. PATENT DOCUMENTS

| | | | |
|---|---|---|---|
| 9,633,728 B2 | 4/2017 | Kitagawa et al. | |
| 10,650,888 B1 | 5/2020 | Raad et al. | |
| 2010/0226192 A1 | 9/2010 | Moon et al. | |
| 2010/0277997 A1 | 11/2010 | Kim | |
| 2011/0205812 A1* | 8/2011 | Kajigaya | G11C 11/4097 365/205 |
| 2014/0254238 A1 | 9/2014 | Gilbert et al. | |

(Continued)

FOREIGN PATENT DOCUMENTS

CN   109461736 A  *  3/2019  ........... G11C 11/221

OTHER PUBLICATIONS

ECEN474/704: (Analog) VLSI Circuit Design Spring 2018; all pages (Year: 2018).*

(Continued)

*Primary Examiner* — Fernando Hidalgo
(74) *Attorney, Agent, or Firm* — Holland & Hart LLP

(57) ABSTRACT

Methods, systems, and devices for deck-level signal development cascodes are described. A memory device may include transistors that support both a signal development and decoding functionality. In a first operating condition (e.g., an open-circuit condition), a transistor may be operable to isolate first and second portions of an access line based on a first voltage applied to a gate of the transistor. In a second operating condition (e.g., a signal development condition), the transistor may be operable to couple the first and second portions of the access line and generate an access signal based on a second voltage applied to the gate of the transistor. In a third operating condition (e.g., a closed-circuit condition), the transistor may be operable to couple the first and second portions of the access line based on applying a third voltage greater than the second voltage to the gate of the transistor.

25 Claims, 9 Drawing Sheets

(56) References Cited

U.S. PATENT DOCUMENTS

2020/0202907 A1* 6/2020 Yudanov ........... G11C 11/40603
2021/0125660 A1* 4/2021 Maejima ............. G11C 11/4074

OTHER PUBLICATIONS

Analysis of MOSFET as a Switch with Circuit Diagram, Example (electronicshub.org); all pages; Ravi Teja. (Year: 2021).*

"International Search Report and Written Opinion of the International Searching Authority," issued in connection with Int'l Appl. No. PCT/US2022/074832 dated Nov. 18, 2022 (9 pages).

* cited by examiner

US 11,837,269 B2

DECK-LEVEL SIGNAL DEVELOPMENT CASCODES

FIELD OF TECHNOLOGY

The following relates to memory devices, including deck-level signal development cascodes.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D Xpoint), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
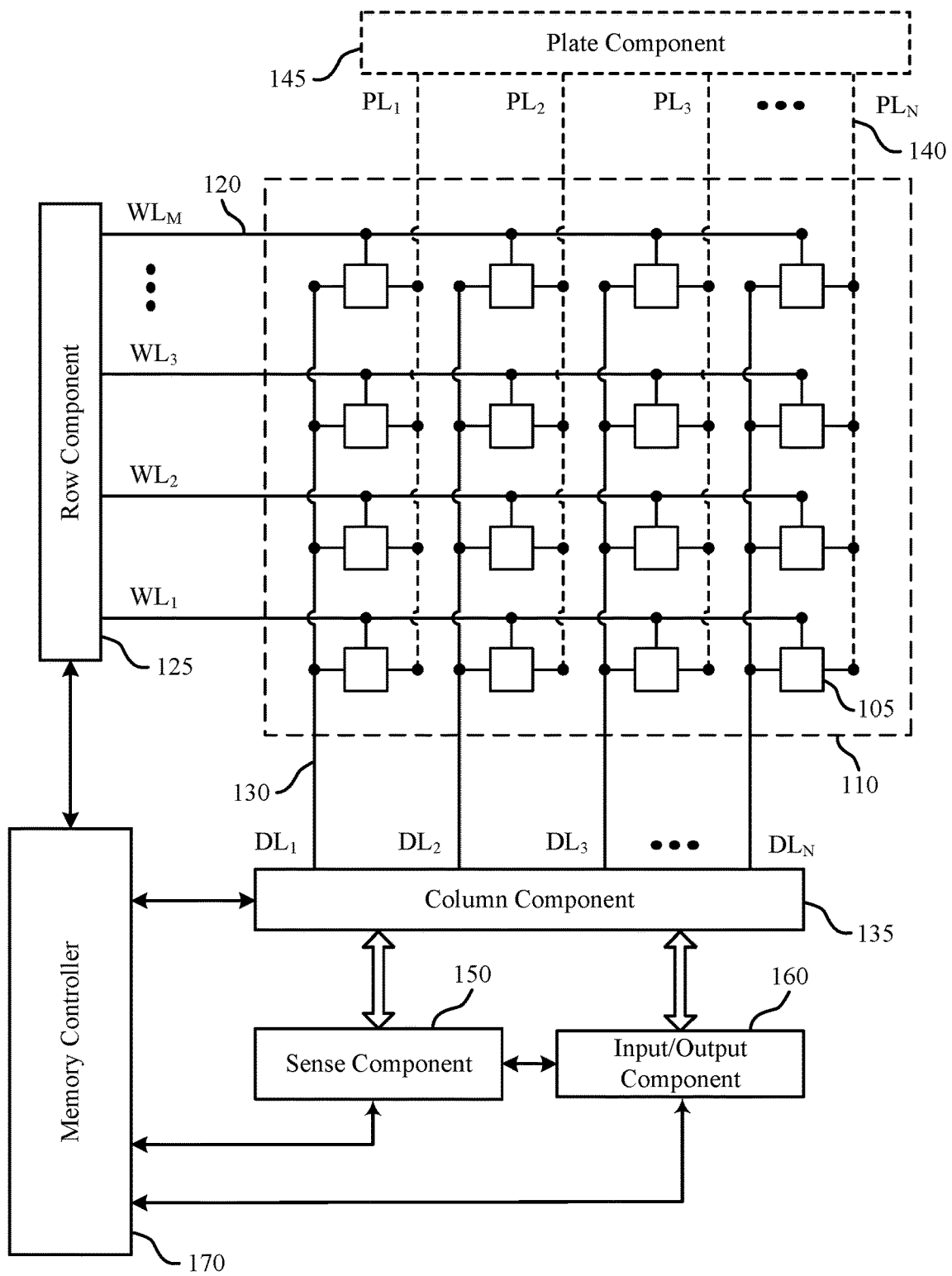
FIG. 1 illustrates an example of a memory device that supports deck-level signal development cascodes in accordance with examples as disclosed herein.

Memory devices may include various arrangements of memory arrays formed over a substrate, and memory cells of the memory arrays may be organized or addressed in accordance with rows and columns. In some examples, circuitry that supports accessing or operating the memory arrays may be located below the memory arrays, which may refer to a location that is at least in part between the memory arrays and the substrate. For example, decoding or multiplexing circuitry, signal development circuitry, or sensing circuitry, among other types of circuitry, may be located below the memory arrays and, in some examples, may include transistors that are formed at least in part by doping portions of the substrate (e.g., substrate-based transistors, transistors having channels formed from doped crystalline silicon or other semiconductors). As memory devices scale with a greater quantity of layers or decks above a substrate, an area of a substrate used for such supporting circuitry may increase, which may lead to various scaling limitations (e.g., related to the limited area of a substrate to support a growing quantity of decks and, by extension, a growing quantity and area for such supporting circuitry).

In accordance with examples as disclosed herein, a memory device may include circuitry supporting a signal development functionality and a decoding functionality. By combining such functionalities, the memory device may realize reduced area for such circuitry (e.g., more compact circuitry) or a reduced quantity of components in the circuitry, among other benefits. For example, the memory device may include one or more decks of memory cells formed over a substrate, and one or more transistors for a respective deck that provide cascode functionality for the deck, deck selection functionality for the deck, or a combination thereof. In a first operating condition, a transistor may be operable to isolate a first portion of an access line from a second portion of the access line, which may be based on a first voltage being applied to a gate of the transistor. In a second operating condition, the transistor may be operable to couple the first portion of the access line with the second portion of the access line, which may be based on a second voltage being applied to a gate of the transistor (e.g., during a read operation). In some such examples, the second operating condition may support read signal development by operating the transistor in a cascode or voltage control configuration that is based on the second voltage. For example, the transistor may support controlling the voltage of the second portion of the access line based on a logic state stored by a memory cell coupled with the access line. In a third operating condition, the transistor may be operable to couple the first portion of the access line with the second portion of the access line, which may be based on applying a third voltage that is greater than the second voltage to the gate of the transistor (e.g., during a write operation). Thus, in some examples, a single transistor may provide a signal development functionality (e.g., during a read operation) as well as a selection or decoding functionality (e.g., a coupling when a memory cell is selected for a read operation or a write operation, an isolation when a memory cell is not selected for an access operation). In some examples, the circuitry may include a plurality of transistors that provide the signal development functionality and the decoding functionality.

Features of the disclosure are initially described in the context of a memory device and related circuitry as described with reference to FIGS. 1-3. Features of the disclosure are described in the context of a signal development component, a timing diagram, a circuit, and a memory structure as described with reference to FIGS. 4-7. These and other features of the disclosure are further illustrated by and described with reference to an apparatus diagram and flowcharts that relate to deck-level signal development cascodes as described with references to FIGS. 8-9.

FIG. 1 illustrates an example of a memory device 100 that supports deck-level signal development cascodes in accordance with examples as disclosed herein. The memory device 100 may also be referred to as a memory die or an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states (e.g., as a multi-level cell). The set of memory cells 105 may be part of a memory array 110 of the memory device 100, where, in some examples, a memory array 110 may refer to a contiguous tile of memory cells 105 (e.g., a contiguous set of elements of a semiconductor chip).

In some examples, a memory cell 105 may store an electric charge representative of the programmable logic states (e.g., storing charge in a capacitor, capacitive memory element, or capacitive storage element). In some examples, a charged and uncharged capacitor may represent two logic states, respectively. In some other examples, a positively charged (e.g., a first polarity, a positive polarity) and negatively charged (e.g., a second polarity, a negative polarity) capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 105. In some examples, such as FeRAM architectures, a memory cell 105 may include a ferroelectric capacitor having a ferroelectric material as an insulating (e.g., non-conductive) layer between terminals of the capacitor. Different levels or polarities of polarization of a ferroelectric capacitor may represent different logic states (e.g., supporting two or more logic states in a respective memory cell 105).

In some examples, a memory cell 105 may include or otherwise be associated with a configurable material, which may be referred to as a material memory element, a material storage element, a material portion, and others. The configurable material may have one or more variable and configurable characteristics or properties (e.g., material states) that may represent different logic states. For example, a configurable material may take different forms, different atomic configurations, different degrees of crystallinity, different atomic distributions, or otherwise maintain different characteristics that may be leveraged to represent one logic state or another. In some examples, such characteristics may be associated with different electrical resistances, different threshold characteristics, or other properties that are detectable or distinguishable during a read operation to identify a logic state written to or stored by the configurable material.

In some cases, a configurable material of a memory cell 105 may be associated with a threshold voltage. For example, electrical current may flow through the configurable material when a voltage greater than the threshold voltage is applied across the memory cell 105, and electrical current may not flow through the configurable material, or may flow through the configurable material at a rate below some level (e.g., according to a leakage rate), when a voltage less than the threshold voltage is applied across the memory cell 105. Thus, a voltage applied to memory cells 105 may result in different current flow, or different perceived resistance, or a change in resistance (e.g., a thresholding or switching event) depending on whether a configurable material portion of the memory cell 105 was written with one logic state or another. Accordingly, the magnitude of current, or other characteristic (e.g., thresholding behavior, resistance breakdown behavior, snapback behavior) associated with the current that results from applying a read voltage to the memory cell 105, may be used to determine a logic state written to or stored by memory cell 105.

In the example of memory device 100, each row of memory cells 105 may be coupled with one or more word lines 120 (e.g., $WL_1$ through $WL_M$), and each column of memory cells 105 may be coupled with one or more digit lines 130 (e.g., $DL_1$ through $DL_N$). Each of the word lines 120 and digit lines 130 may be an example of an access line of the memory device 100. In general, one memory cell 105 may be located at the intersection of (e.g., coupled with, coupled between) a word line 120 and a digit line 130. This intersection may be referred to as an address of a memory cell 105. A target or selected memory cell 105 may be a memory cell 105 located at the intersection of an energized or otherwise selected word line 120 and an energized or otherwise selected digit line 130.

In some architectures, a storage component of a memory cell 105 may be electrically isolated (e.g., selectively isolated) from a digit line 130 by a cell selection component, which, in some examples, may be referred to as a switching component or a selector device of or otherwise associated with the memory cell 105. A word line 120 may be coupled with the cell selection component (e.g., via a control node or terminal of the cell selection component), and may control the cell selection component of the memory cell 105. For example, the cell selection component may be a transistor and the word line 120 may be coupled with a gate of the transistor (e.g., where a gate node of the transistor may be a control node of the transistor). Activating a word line 120 may result in an electrical connection or closed circuit between a respective logic storing component of one or more memory cells 105 and one or more corresponding digit lines 130, which may be referred to as activating the one or more memory cells 105 or coupling the one or more memory cells 105 with a respective one or more digit lines 130. A digit line 130 may then be accessed to read from or write to the respective memory cell 105.

In some examples, memory cells 105 may also be coupled with one or more plate lines 140 (e.g., $PL_1$ through $PL_N$). In some examples, each of the plate lines 140 may be independently addressable (e.g., supporting individual selection or biasing). In some examples, the plurality of plate lines 140 may represent or be otherwise functionally equivalent with a common plate, or other common node (e.g., a plate node common to each of the memory cells 105 in the memory array 110). When a memory cell 105 employs a capacitor for storing a logic state, a digit line 130 may provide access to a first terminal or a first plate of the capacitor, and a plate line 140 may provide access to a second terminal or a second plate of the capacitor. Although the plurality of plate lines 140 of the memory device 100 are shown as substantially parallel with the plurality of digit lines 130, in other examples, a plurality of plate lines 140 may be substantially parallel with the plurality of word lines 120, or in any other configuration (e.g., a common planar conductor, a common plate layer, a common plate node).

Access operations such as reading, writing, rewriting, and refreshing may be performed on a memory cell 105 by activating or selecting a word line 120, a digit line 130, or a plate line 140 coupled with the memory cell 105, which may include applying a voltage, a charge, or a current to the respective access line. Upon selecting a memory cell 105 (e.g., in a read operation), a resulting signal may be used to determine the logic state stored by the memory cell 105. For example, a memory cell 105 with a capacitive memory element storing a logic state may be selected, and the resulting flow of charge via an access line or resulting voltage of an access line may be detected to determine the programmed logic state stored by the memory cell 105.

Accessing memory cells 105 may be controlled using a row component 125 (e.g., a row decoder), a column component 135 (e.g., a column decoder), or a plate component 145 (e.g., a plate decoder), or a combination thereof. For example, a row component 125 may receive a row address from the memory controller 170 and activate a corresponding word line 120 based on the received row address. Similarly, a column component 135 may receive a column address from the memory controller 170 and activate a corresponding digit line 130. In some examples, such access operations may be accompanied by a plate component 145 biasing one or more of the plate lines 140 (e.g., biasing one of the plate lines 140, biasing some or all of the plate lines 140, biasing a common plate).

In some examples, the memory controller 170 may control operations (e.g., read operations, write operations, rewrite operations, refresh operations) of memory cells 105 using one or more components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired word line 120 and digit line 130. The memory controller 170 may also generate or control various voltages or currents used during the operation of memory device 100.

A memory cell 105 may be read (e.g., sensed) by a sense component 150 when the memory cell 105 is accessed (e.g., in cooperation with the memory controller 170) to determine a logic state written to or stored by the memory cell 105. For example, the sense component 150 may be configured to evaluate a current or charge transfer through or from the memory cell 105, or a voltage resulting from coupling the memory cell 105 with the sense component 150, responsive to a read operation. The sense component 150 may provide an output signal indicative of the logic state read from the memory cell 105 to one or more components (e.g., to the column component 135, the input/output component 160, to the memory controller 170).

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set or subset of digit lines 130 connected to the sense component 150. For example, a sense component 150 may include a separate sensing circuit (e.g., a separate or duplicated sense amplifier, a separate or duplicated signal development component) for each of a set of digit lines 130 coupled with the sense component 150, such that a logic state may be separately detected for a respective memory cell 105 coupled with a respective one of the set of digit lines 130.

In some memory architectures, accessing a memory cell 105 may degrade or destroy a stored logic state, and rewrite or refresh operations may be performed to return the stored logic state to memory cell 105. In DRAM or FeRAM, for example, a capacitor of a memory cell 105 may be partially or completely discharged or depolarized during a sense operation, thereby corrupting the logic state that was stored in the memory cell 105. Thus, in some examples, the logic state stored in a memory cell 105 may be rewritten after an access operation. Further, activating a single word line 120, digit line 130, or plate line 140 may result in the discharge of all memory cells 105 coupled with the activated word line 120, digit line 130, or plate line 140. Thus, several or all memory cells 105 coupled with an word line 120, digit line 130, or plate line 140 associated with an access operation (e.g., all cells of an accessed row, all cells of an accessed column) may be rewritten after an access operation.

In some examples, reading a memory cell 105 may be non-destructive. That is, the logic state of the memory cell 105 may not need to be rewritten after the memory cell 105 is read. However, in some examples, refreshing the logic state of the memory cell 105 may be used to mitigate more gradual degradations of the state stored in the memory cell 105. For example, the logic state stored by a memory cell 105 may be refreshed at periodic intervals by applying an appropriate write, rewrite, or refresh bias to maintain the stored logic state. Refreshing the memory cell 105 may reduce or eliminate data corruption due to a degradation of stored state over time.

A memory cell 105 may be set, or written, by activating the relevant word line 120, digit line 130, or plate line 140 (e.g., via a memory controller 170). In other words, a logic state may be stored in a memory cell 105. A row component 125, column component 135, or plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to or across a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element). In the case of a material memory architecture, a memory cell 105 may be written by applying a current, voltage, or other heating or biasing to a material memory element to configure the material according to a corresponding logic state.

In accordance with examples as disclosed herein, one or more components of the memory device 100 may be configured to support deck-level signal development cascodes. For example, the memory device 100 may include memory arrays 110 arranged in a stack of one or more decks (e.g., levels, layers) formed over a substrate, and each memory array 110 may be associated with one or more transistors that provide a signal development functionality for the memory array 110 and a selection functionality for the memory array 110. For example, in a first operating condition, a transistor may be operable to isolate a first portion of an access line from a second portion of the access line (e.g., isolating a digit line 130 from the column component 135 or the sense component 150, or some portion thereof), which may be based on a first voltage being applied to a gate of the transistor. In a second operating condition, the transistor may be operable to couple the first portion of the access line with the second portion of the access line based on a second voltage being applied to a gate of the transistor (e.g., during a read operation). In some such examples, the second operating condition may support read signal development by operating the transistor in a cascode or voltage control configuration that is based on the second voltage. For example, the transistor may control the voltage of the second portion of the access line based on a logic state stored by a memory cell coupled with the access line. In a third operating condition, the transistor may be operable to couple the first portion of the access line with the second portion of the access line based on applying a third voltage that is greater than the second voltage to the gate of the transistor (e.g., during a write operation). Thus, in some examples, a single transistor may provide a signal development functionality (e.g., during a read operation) as well as a selection or decoding functionality (e.g., a coupling when a memory cell is selected for a read operation or a write operation, an isolation when a memory cell is not selected for an access operation). In some other examples, the circuitry may include a plurality of transistors that provide the signal development functionality and the decoding functionality. Implementing deck-level signal development cascodes circuitry at various decks of such a memory device 100 may support reduced area for such circuitry (e.g., more compact circuitry) or a reduced quantity of components in the circuitry, among other benefits.

Figure 2:
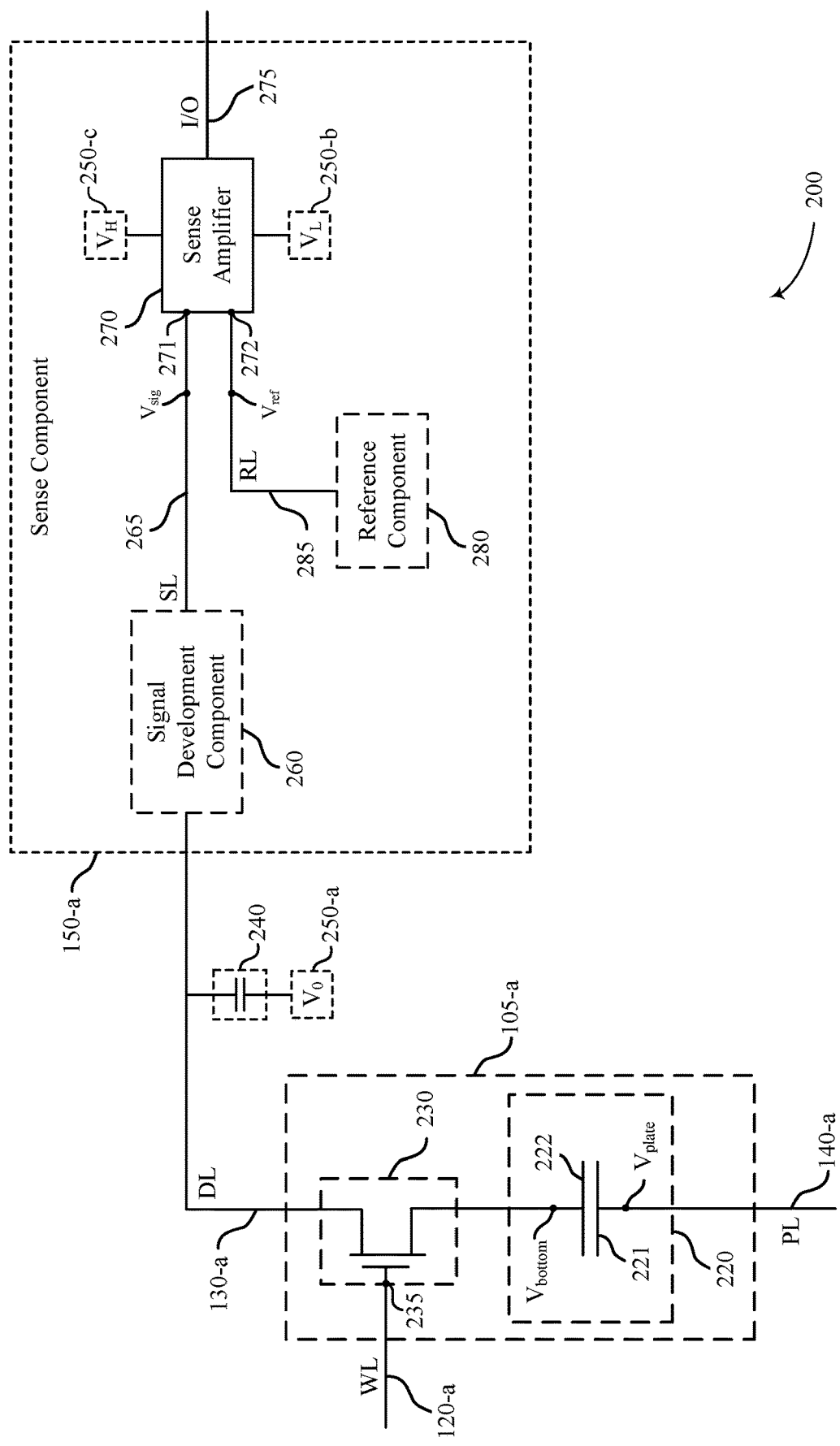
FIG. 2 illustrates an example of a circuit that supports deck-level signal development cascodes in accordance with examples as disclosed herein.

FIG. 2 illustrates an example of a circuit 200 that supports deck-level signal development cascodes in accordance with examples as disclosed herein. The circuit 200 includes a memory cell 105-a and a sense component 150-a, which may be examples of the respective components as described with reference to FIG. 1. Circuit 200 also includes a word line 120-a, a digit line 130-a, and a plate line 140-a, which may be examples of the respective access lines described with reference to FIG. 1. In various examples, the plate line 140-a may be illustrative of an independently-addressable plate line 140-a, or a common plate node (e.g., of a memory array 110 that includes the memory cell 105-a). In some memory architectures (e.g., DRAM), the plate line 140-a may be an example of a ground node, such as Vss. In some other memory architectures (e.g., FeRAM), the plate line 140-a may be biased to different voltage levels during different portions of operations performed using the memory cell 105-a.

The memory cell 105-a may include a logic storage component (e.g., a memory element, a storage element, a memory storage element), such as a capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The cell plate 221 may be accessed via the plate line 140-a and cell bottom 222 may be accessed via the digit line 130-a. As described herein, various logic states may be stored by charging, discharging, or polarizing the capacitor 220.

The capacitor 220 may be electrically connected to the digit line 130-a, and the stored logic state of the capacitor 220 may be read or sensed by operating various elements represented in circuit 200. For example, the memory cell 105-a may also include a cell selection component 230 which, in some examples, may be referred to as a switching component or a selector device coupled with or between an access line (e.g., the digit line 130-a) and the capacitor 220. In some examples, a cell selection component 230 may be considered to be outside the illustrative boundary of the memory cell 105-a, and the cell selection component 230 may be referred to as a switching component or selector device coupled with or between an access line (e.g., the digit line 130-a) and the memory cell 105-a.

The capacitor 220 may be selectively coupled with the digit line 130-a when the cell selection component 230 is activated (e.g., by way of an activating logical signal), and the capacitor 220 can be selectively isolated from the digit line 130-a when the cell selection component 230 is deactivated (e.g., by way of a deactivating logical signal). A logical signal or other selection signal or voltage may be applied to a control node 235 of the cell selection component 230 (e.g., via the word line 120-a). In other words, the cell selection component 230 may be configured to selectively couple or decouple the capacitor 220 and the digit line 130-a based on a logical signal or voltage applied via the word line 120-a to the control node 235.

Activating the cell selection component 230 may be referred to as selecting or activating the memory cell 105-a, and deactivating the cell selection component 230 may be referred to as deselecting or deactivating the memory cell 105-a. In some examples, the cell selection component 230 is a transistor and its operation may be controlled by applying an activation voltage to the transistor gate (e.g., a control or selection node or terminal). The voltage for activating the transistor (e.g., the voltage between the transistor gate terminal and the transistor source terminal) may be a voltage greater than the threshold voltage magnitude of the transistor. In some examples, activating the cell selection component 230 may be referred to as selectively coupling the memory cell 105-a with the digit line 130-a.

Biasing the plate line 140-a or the digit line 130-a may result in a voltage difference (e.g., the voltage of the digit line 130-a minus the voltage of the plate line 140-a) across the capacitor 220. The voltage difference may accompany a change in the charge stored by the capacitor 220 (e.g., due to charge sharing between the capacitor 220 and the digit line 130-a, due to charge sharing between the capacitor 220 and the plate line 140-a), and the magnitude of the change in stored charge may depend on the initial state of the capacitor 220 (e.g., whether the initial charge or logic state stored a logic 1 or a logic 0).

The digit line 130-*a* may be coupled with additional memory cells 105 (not shown), and the digit line 130-*a* may have properties that result in a non-negligible intrinsic capacitance 240 (e.g., on the order of picofarads (pF)), which may couple the digit line 130-*a* with a voltage source 250-*a*. The voltage source 250-*a* may represent a common ground or virtual ground voltage, or the voltage of an adjacent access line of the circuit 200 (not shown). Although illustrated as a separate element in FIG. 2, the intrinsic capacitance 240 may be associated with properties distributed throughout the digit line 130-*a*.

The sense component 150-*a* may include a signal development component 260 and a sense amplifier 270 coupled with the signal development component 260 via a signal line 265. In various examples, the signal development component 260 may include circuitry configured to amplify or otherwise convert signals of the digit line 130-*a* prior to a logic state detection operation (e.g., by the sense amplifier 270). The signal development component 260 may include, for example, a transistor, an amplifier, a cascode, or any other circuitry configured to develop a signal for sensing a logic state stored by the memory cell 105-*a*. In some examples, the signal development component 260 may include a charge transfer sensing amplifier, which may include one or more transistors in a cascode or voltage control configuration.

Although the digit line 130-*a* and the signal line 265 are identified as separate lines, the digit line 130-*a*, the signal line 265, and any other lines connecting a memory cell 105 with a sense amplifier 270 may be referred to as a single access line (e.g., of or associated with the memory cell 105). Constituent portions of such an access line may be identified separately for the purposes of illustrating intervening components and intervening signals in various example configurations.

The sense amplifier 270 may include a first node 271 and a second node 272 which, in some examples, may be coupled with different access lines of a circuit (e.g., a signal line 265 and a reference line 285 of the circuit 200, respectively) or, in other examples, may be coupled with a common access line of a different circuit (not shown). In some examples, the first node 271 may be referred to as a signal node, and the second node 272 may be referred to as a reference node. However, other configurations of access lines or reference lines may be used to support the techniques described herein.

The sense amplifier 270 may include various transistors or amplifiers to detect, convert, or amplify a difference in signals, which may be referred to as latching. For example, the sense amplifier 270 may include circuit elements that receive and compare a sense signal voltage (e.g., $V_{sig}$, of the signal line 265) at a first node 271 with a reference signal voltage (e.g., $V_{ref}$, of a reference line 285) at a second node 272. A voltage of the first node 271 may be based on accessing the memory cell 105-*a*, such as a voltage based at least in part on a charge transfer of the capacitor 220 while the cell selection component 230 is activated. In some examples, a voltage of the second node 272 may be provided by a reference component 280. In other examples, the reference component 280 may be omitted and a reference voltage may be provided, for example, by accessing the memory cell 105-*a* to generate the reference voltage (e.g., in a self-referencing access operation). An output of the sense amplifier 270 may be driven to a relatively higher voltage (e.g., a positive voltage) or a relatively lower voltage (e.g., a negative voltage, a ground voltage) based on the comparison at the sense amplifier 270.

The sense amplifier 270 may output a detected logic state via one or more I/O lines 275 based on a comparison of signals at the first node 271 and the second node 272. For example, if the first node 271 has a lower voltage than the second node 272, an output of the sense amplifier 270 may be driven to a relatively lower voltage of a first sense amplifier voltage source 250-*b* (e.g., a voltage of $V_L$, which may be a ground voltage substantially equal to $V_0$ or a negative voltage). If the first node 271 has a higher voltage than the second node 272, an output of the sense amplifier 270 may be driven to the voltage of a second sense amplifier voltage source 250-*c* (e.g., a voltage of $V_H$). The sense component 150-*a* may latch the output of the sense amplifier 270 to determine the logic state stored in the memory cell 105-*a* (e.g., latching or determining a logic 0 when the first node 271 has a lower voltage than the second node 272, latching or determining a logic 1 when the first node 271 has a higher voltage than the second node 272). The latched output of the sense amplifier 270, corresponding to the detected logic state of memory cell 105-*a*, may be output via one or more input/output (I/O) lines (e.g., I/O line 275), which may include an output through a column component 135 or an input/output component 160 described with reference to FIG. 1.

To perform a write operation on the memory cell 105-*a*, a voltage may be applied across the capacitor 220 by controlling the voltage of the cell plate 221 (e.g., through the plate line 140-*a*) and the cell bottom 222 (e.g., through the digit line 130-*a*). For example, to write a logic 0, the cell plate 221 may be taken low (e.g., grounding the plate line 140-*a*, virtually grounding the plate line 140-*a*, applying a negative voltage to the plate line 140-*a*), and the cell bottom 222 may be taken high (e.g., applying a positive voltage to the digit line 130-*a*). The opposite process may be performed to write a logic 1, where the cell plate 221 is taken high and the cell bottom 222 is taken low. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220.

The circuit 200, including the sense amplifier 270, the cell selection component 230, the signal development component 260, or the reference component 280, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., a drain terminal and the source terminal, across a conduction channel).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In some examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching, and selective conductivity across the transistor may also be a function of varying drain and source voltages. For example, the applied voltage at the gate terminal may have a particular voltage level (e.g., a clamping voltage) that is used to enable conductivity between the drain terminal and the source terminal when the source terminal voltage is below a certain level (e.g., below the gate terminal voltage minus the threshold voltage). When the voltage of the source terminal rises above the certain level, the n-type transistor may be deactivated such that the conductive path between the drain terminal and source terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., a drain terminal and the source terminal, across a conductive channel).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In some examples where a p-type transistor is employed as a switching component, the voltage of a logical signal applied to the gate terminal may be selected to operate the transistor at a particular working point (e.g., in a saturation region or in an active region).

In some examples, the behavior of a p-type transistor may be more complex than a logical switching by the gate voltage, and selective conductivity across the transistor may also be a function of varying drain and source voltages. For example, the applied voltage at the gate terminal may have a particular voltage level that is used to enable conductivity between the drain terminal and the source terminal so long as the source terminal voltage is above a certain level (e.g., above the gate terminal voltage plus the threshold voltage). When the voltage of the source terminal voltage falls below the certain level, the p-type transistor may be deactivated such that the conductive path between the drain terminal and source terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In some examples, the transistor(s) may be formed on a substrate that is dedicated to a particular component of the circuit 200 (e.g., a substrate for the sense amplifier 270, a substrate for the signal development component 260, a substrate for the reference component 280, a substrate for the memory cell 105-a), or the transistor(s) may be formed on a substrate that is common for particular components of the circuit 200 (e.g., a substrate that is common to two or more of the sense amplifier 270, the signal development component 260, the reference component 280, or the memory cell 105-a). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

Although the circuit 200 illustrates a set of components relative to a single memory cell 105, various components of the circuit 200 may be duplicated in a memory device 100 to support various operations. For example, to support row access or page access operations, a sense component 150 may be configured with multiples of one or more of a signal development component 260, a signal line 265, a reference component 280, a reference line 285, a sense amplifier 270, or other components, where the multiples may be configured according to a quantity of memory cells 105 that may be accessed in a row access or page access operation (e.g., in a concurrent operation).

In accordance with examples as disclosed herein, the circuit 200 (e.g., the signal development component 260) may include a transistor that supports a decoding functionality (e.g., for coupling or isolation between the digit line 130-a and the signal line 265) and a signal development functionality (e.g., generating a read signal at the signal line 265 that is based on a logic state stored at the memory cell 105-a). In some examples, such a transistor may support a deck decoding or deck selection functionality, and may be located on a same deck as a memory array 110 that includes the memory cell 105-a. By combining such functionalities, a memory device 100 that includes the circuit 200 may realize reduced area for such circuitry (e.g., more compact circuitry) or a reduced quantity of components in the circuitry, among other benefits.

Figure 3A:
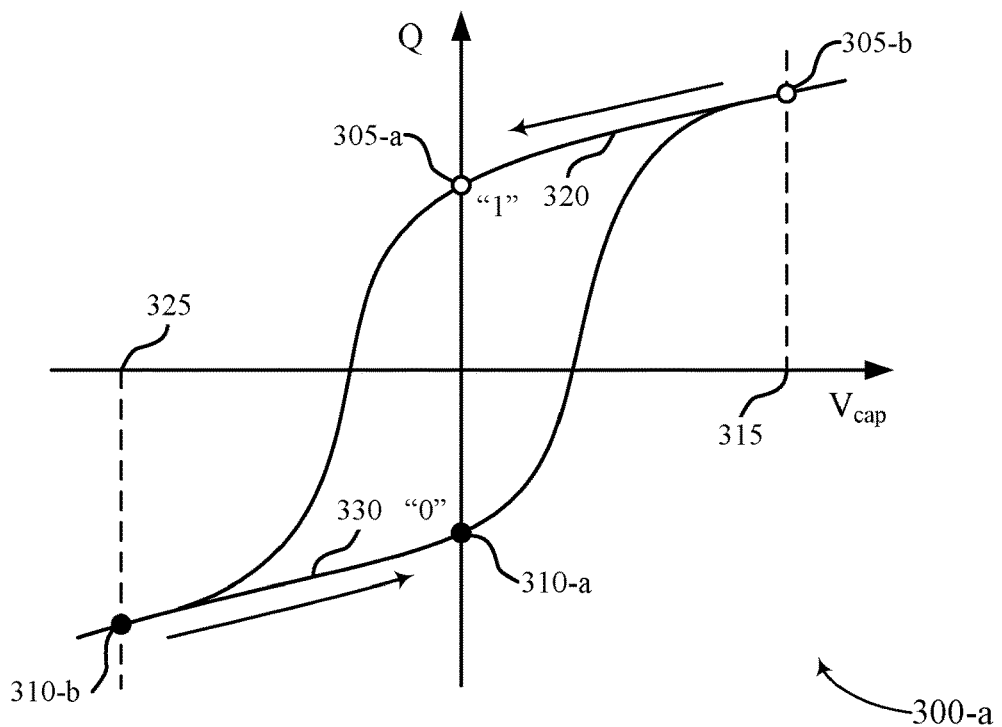
FIGS. 3A and 3B illustrate examples of non-linear electrical properties of a ferroelectric memory cell in accordance with examples as disclosed herein.
Figure 3B:
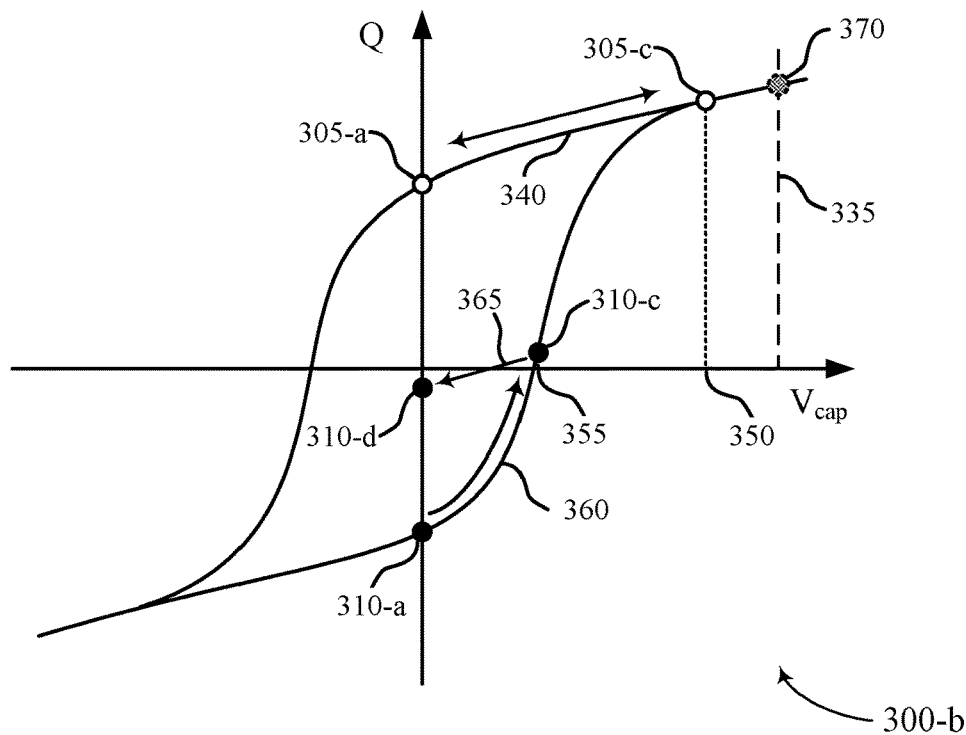

FIGS. 3A and 3B illustrate examples of non-linear electrical properties of a ferroelectric memory cell with hysteresis plots 300-a and 300-b, respectively, in accordance with examples as disclosed herein. The hysteresis plots 300-a and 300-b may illustrate aspects of a writing process and a reading process, respectively, for a memory cell 105 employing a ferroelectric capacitor 220 as described with reference to FIG. 2. The hysteresis plots 300-a and 300-b depict the charge, Q, stored on a ferroelectric capacitor 220 as a function of a voltage difference $V_{cap}$, between the terminals of the ferroelectric capacitor 220 (e.g., when charge is permitted to flow into or out of the ferroelectric capacitor 220 according to the voltage difference $V_{cap}$). For example, the voltage difference $V_{cap}$ may represent the difference in voltage between a cell bottom 222 and a cell plate 221 (e.g., $V_{bottom} - V_{plate}$, $V_{DL} - V_{PL}$).

A ferroelectric material is characterized by an electric polarization where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge may be stored at the interface of the ferroelectric material and the capacitor terminals.

As depicted in the hysteresis plot 300-a, a ferroelectric material used in a ferroelectric capacitor 220 may maintain a positive or negative polarization when there is no net voltage difference between the terminals of the ferroelectric capacitor 220. For example, the hysteresis plot 300-a illustrates two possible polarization states, a charge state 305-a and a charge state 310-a, which may represent a negatively saturated polarization state and a positively saturated polarization state, respectively. The charge states 305-a and 310-a may be at a physical condition illustrating remnant polarization (Pr) values, which may refer to the polarization (or charge) that remains upon removing an external bias (e.g., voltage). According to the example of the hysteresis plot 300-a, the charge state 305-a may represent a logic 1 when no voltage difference is applied across the ferroelectric capacitor 220, and the charge state 310-a may represent a logic 0 when no voltage difference is applied across the ferroelectric capacitor 220. In some examples, the logic values of the respective charge states or polarization states may be reversed or interpreted in an opposite manner to accommodate other schemes for operating a memory cell 105.

A logic 0 or 1 may be written to the memory cell 105 by controlling the electric polarization of the ferroelectric material, and thus the charge on the capacitor terminals, by applying a net voltage difference across the ferroelectric capacitor 220. For example, the voltage 315 may be a voltage equal to or greater than a positive saturation voltage, and applying the voltage 315 across the ferroelectric capacitor 220 may result in charge accumulation until the charge state 305-b is reached (e.g., writing a logic 1). Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between the charge state 305-b and the charge state 305-a at zero voltage across the capacitor. In other words, charge state 305-a may represent a logic 1 state at an equalized voltage across a ferroelectric capacitor 220 that has been positively saturated.

Similarly, voltage 325 may be a voltage equal to or lesser than a negative saturation voltage, and applying the voltage 325 across the ferroelectric capacitor 220 may result in charge accumulation until the charge state 310-b is reached (e.g., writing a logic 0). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between the charge state 310-b and the charge state 310-a at zero voltage across the capacitor. In other words, charge state 310-a may represent a logic 0 state at an equalized voltage across a ferroelectric capacitor 220 that has been negatively saturated. In some examples, the voltage 315 and the voltage 325, representing saturation voltages, may have the same magnitude, but opposite polarity across the ferroelectric capacitor 220. Although the example of hysteresis plot 300-a illustrates a logic 0 corresponding to charge state 310-a, and a logic 1 corresponding to charge state 305-a, logic states may correspond to different charge states in some examples, such as a logic 0 corresponding to charge state 305-a and a logic 1 corresponding to charge state 310-a, among other examples.

To read, or sense, the stored state of a ferroelectric capacitor 220, a voltage may also be applied across the ferroelectric capacitor 220. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state or access line voltage resulting from a read operation may depend on whether the charge state 305-a, or the charge state 310-a, or some other charge state was initially stored, among other factors.

The hysteresis plot 300-b illustrates an example for reading stored charge states 305-a and 310-a. A read voltage 335 may be applied, for example, as a voltage difference via a digit line 130-a and a plate line 140-a as described with reference to FIG. 2. The hysteresis plot 300-b may illustrate read operations where the read voltage 335 is positive voltage difference $V_{cap}$ (e.g., where $V_{bottom}-V_{plate}$ is positive, where $V_{DL}$ is greater than $V_{PL}$). A positive read voltage across the ferroelectric capacitor 220 may be referred to as a "plate low" read operation, where a digit line 130-a is taken initially to a high voltage, and a plate line 140-a is initially at a low voltage (e.g., a ground voltage). Although the read voltage 335 is shown as a positive voltage across the ferroelectric capacitor 220, in alternative access operations a read voltage may be a negative voltage across the ferroelectric capacitor 220, which may be referred to as a "plate high" read operation.

The read voltage 335 may be applied across the ferroelectric capacitor 220 while a memory cell 105 is selected (e.g., by activating a cell selection component 230 via a word line 120-a as described with reference to FIG. 2). Upon applying the read voltage 335 to the ferroelectric capacitor 220, charge may flow into or out of the ferroelectric capacitor 220 via the associated digit line 130-a and plate line 140-a, and, in some examples, different charge states or access line voltages may result depending on whether the ferroelectric capacitor 220 was at the charge state 305-a (e.g., storing a logic 1) or at the charge state 310-a (e.g., storing a logic 0), or some other charge state.

When performing a read operation on a ferroelectric capacitor 220 at the charge state 305-a (e.g., a logic 1), additional positive charge may accumulate across the ferroelectric capacitor 220, and the charge state may follow path 340 until reaching the charge and voltage of the charge state 305-c. The amount of charge flowing through the capacitor 220 may be related to the intrinsic or other capacitance of the digit line 130-a or other access line. In a "plate low" read configuration, a read operation associated with the charge states 305-a and 305-c, or more generally a read operation associated with the logic 1 state, may be associated with a relatively small amount of charge transfer (e.g., compared to a read operation associated with the charge states 310-a and 310-c, or more generally the logic 0 state).

As shown by the transition between the charge state 305-a and the charge state 305-c, the resulting voltage 350 across the ferroelectric capacitor 220 may be a relatively large positive value due to the relatively large change in voltage at the capacitor 220 for the given change in charge. Thus, upon reading a logic 1 in a "plate low" read operation, the digit line voltage, equal to the sum of $V_{PL}$ and $V_{cap}$ (e.g., $V_{bottom}-V_{plate}$) at the charge state 305-c, may be a relatively high voltage. Such a read operation may not change the remnant polarization of the ferroelectric capacitor 220 that stored the charge state 305-a, and thus after performing the read operation the ferroelectric capacitor 220 may return to the charge state 305-a via path 340 when the read voltage 335 is removed (e.g., by applying a zero net voltage across the ferroelectric capacitor 220, by equalizing the voltage across the ferroelectric capacitor 220). Thus, performing a read operation with a positive read voltage on a ferroelectric capacitor 220 with a charge state 305-a may be considered a non-destructive read process.

When performing the read operation on the ferroelectric capacitor 220 at the charge state 310-*a* (e.g., a logic 0), the stored charge may reverse polarity as a net positive charge accumulates across the ferroelectric capacitor 220, and the charge state may follow the path 360 until reaching the charge and voltage of the charge state 310-*c*. The amount of charge flowing through the ferroelectric capacitor 220 may again be related to the intrinsic or other capacitance of the digit line 130-*a* or other access line. In a "plate low" read configuration, a read operation associated with the charge states 310-*a* and 310-*c*, or more generally a read operation associated with the logic 0 state, may be associated with a relatively large amount of charge transfer (e.g., compared to a read operation associated with the charge states 305-*a* and 305-*c*, or more generally the logic 1 state).

As shown by the transition between the charge state 310-*a* and the charge state 310-*c*, the resulting voltage 355 may, in some cases, be a relatively small positive value due to the relatively small change in voltage at the capacitor 220 for the given change in charge. Thus, upon reading a logic 0 in a "plate low" read operation, the digit line voltage, equal to the sum of $V_{PL}$ and $V_{cap}$ (e.g., $V_{bottom} - V_{plate}$) at the charge state 310-*c*, may be a relatively low voltage.

The transition from the charge state 310-*a* to the charge state 310-*d* may be illustrative of a sensing operation that is associated with a partial reduction or partial reversal in polarization or charge of a ferroelectric capacitor 220 of a memory cell 105 (e.g., a reduction in the magnitude of charge Q from the charge state 310-*a* to the charge state 310-*d*). In other words, according to the properties of the ferroelectric material, after performing the read operation the ferroelectric capacitor 220 may not return to the charge state 310-*a* when the read voltage 335 is removed (e.g., by applying a zero net voltage across the ferroelectric capacitor 220, by equalizing the voltage across the ferroelectric capacitor 220). Rather, when applying a zero net voltage across the ferroelectric capacitor 220 after a read operation of the charge state 310-*a* with read voltage 335, the charge state may follow path 365 from the charge state 310-*c* to the charge state 310-*d*, illustrating a net reduction in polarization magnitude (e.g., a less positively polarized charge state than initial charge state 310-*a*, illustrated by the difference in charge between the charge state 310-*a* and the charge state 310-*d*). Thus, performing a read operation with a positive read voltage on a ferroelectric capacitor 220 with a charge state 310-*a* may be described as a destructive read process.

The position of the charge state 305-*c* and the charge state 310-*c* after initiating a read operation may depend on various factors, including the specific sensing scheme and circuitry. In some cases, the final charge may depend on the net capacitance of a digit line 130-*a* coupled with the memory cell 105, which may include an intrinsic capacitance 240, an integrator capacitor (e.g., of a sense component 150), and others. For example, if a ferroelectric capacitor 220 is electrically coupled with a plate line 140-*a* at 0V and the read voltage 335 is applied to a digit line 130-*a*, the voltage of the digit line 130-*a* may fall when the memory cell 105 is selected due to charge flowing from the net capacitance of the digit line 130-*a* to the ferroelectric capacitor 220. Thus, in some examples, a voltage measured at a sense component 150 may not be equal to the read voltage 335, or the resulting voltages 350 or 355, and instead may depend on the voltage of the digit line 130-*a* or other access line following a period of charge sharing.

The initial state (e.g., charge state, logic state) of the ferroelectric capacitor 220 may be determined by comparing the voltage of a digit line 130-*a*, or signal line 265 where applicable, resulting from the read operation with a reference voltage (e.g., via a reference line 285 as described with reference to FIG. 2). In some examples, the digit line voltage may be the sum of the plate line voltage and the final voltage across the ferroelectric capacitor 220 (e.g., voltage 350 when reading the ferroelectric capacitor 220 having a stored charge state 305-*a*, or voltage 355 when reading the ferroelectric capacitor 220 having a stored charge state 310-*a*). In some examples, the digit line voltage may be the difference between the read voltage 335 and the final voltage across the capacitor 220 (e.g., (read voltage 335-voltage 350) when reading the ferroelectric capacitor 220 having a stored charge state 305-*a*, (read voltage 335-voltage 355) when reading the ferroelectric capacitor 220 having a stored charge state 310-*a*).

In some examples, read operations of a memory cell 105 may be associated with a fixed voltage of a digit line 130-*a*, where a charge state of a ferroelectric capacitor 220 after initiating a read operation may be the same regardless of its initial charge state. For example, in a read operation where a digit line 130-*a* is held at a fixed read voltage 335, the ferroelectric capacitor 220 may proceed to a charge state 370 for both the case where the ferroelectric capacitor initially stored a charge state 305-*a* and the case where the ferroelectric capacitor initially stored a charge state 310-*a*. Accordingly, rather than using a difference in voltage of a digit line 130-*a* to detect an initial charge state or logic state, in some examples, the initial charge state or logic state of the ferroelectric capacitor 220 may be determined based at least in part on the difference in charge associated with the read operation. For example, as illustrated by hysteresis plot 300-*b*, a logic 1 may be detected based on difference in charge, Q, between charge state 305-*a* and charge state 370 (e.g., a relatively small amount of charge transfer), and a logic 0 may be detected based on a difference in charge, Q, between charge state 310-*a* and charge state 370 (e.g., a relatively large amount of charge transfer).

In some examples, such a detection may be supported by a charge-transfer sensing amplifier, a cascode (e.g., a transistor operated in a cascode configuration which, in accordance with examples as disclosed herein, may also support a decoding functionality), or other circuitry of a signal development component 260 between a digit line 130-*a* and a signal line 265, and a voltage of the signal line 265 may be based at least in part on the amount of charge transfer of a capacitor 220 after initiating a read operation. In such examples, a voltage of the signal line 265 may be compared with a reference voltage (e.g., at a sense amplifier 270) to determine the logic state initially stored by the ferroelectric capacitor 220, despite a digit line 130-*a* being held at a fixed voltage level.

In some examples where a digit line 130-*a* is held at a fixed read voltage 335, a capacitor 220 may be positively saturated after a read operation irrespective of whether the capacitor 220 was initially at a charge state 305-*a* (e.g., a logic 1) or initially at a charge state 310-*a* (e.g., a logic 0). Accordingly, after such a read operation, the capacitor 220 may, at least temporarily, be charged according to a logic 1 state irrespective of its initial or intended logic state. Thus, a rewrite operation may be performed at least when the capacitor 220 is intended to store a logic 0 state, and such a rewrite operation may include applying a write voltage 325 to store a logic 0 state as described with reference to hysteresis plot 300-*a*. Such rewrite operations may be configured or otherwise described as a selective rewrite operation, since a rewrite voltage may not need to be applied when the capacitor 220 is intended to store a logic 1 state. In some examples, such an access scheme may be referred to as a "2Pr" scheme, where the difference in charge for distinguishing a logic 0 from a logic 1 may be equal to two times the remnant polarization of a memory cell 105 (e.g., a difference in charge between charge state 305-a, a positively saturated charge state, and charge state 310-a, a negatively saturated charge state).

Figure 4:
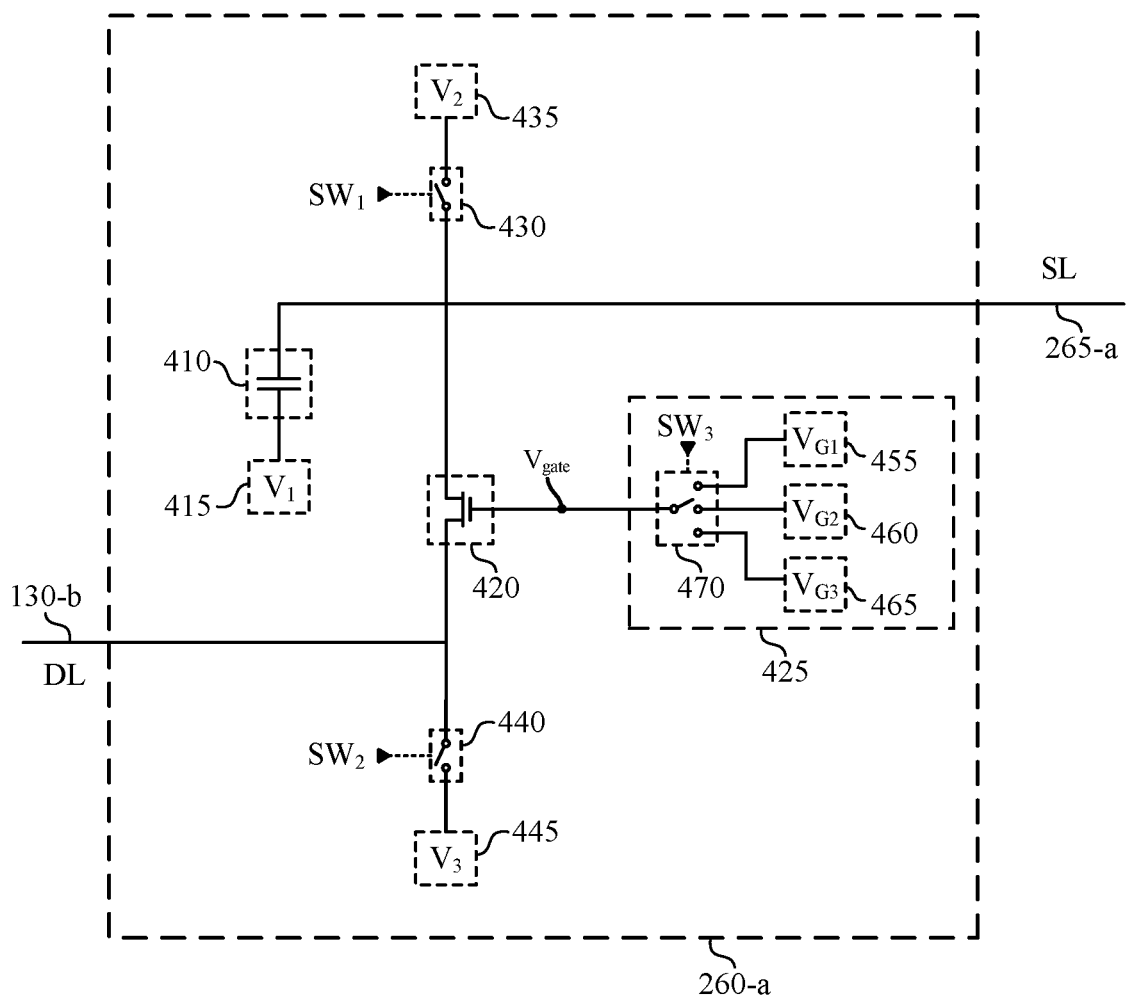
FIG. 4 illustrates an example of a signal development component that supports deck-level signal development cascodes in accordance with examples as disclosed herein.

FIG. 4 illustrates an example of a signal development component 260-a that supports deck-level signal development cascodes in accordance with examples as disclosed herein. The signal development component 260-a may be an example of a signal development component 260 described with reference to FIG. 2. The signal development component 260-a may be coupled with or between a digit line 130-b and a signal line 265-a. In some examples, the digit line 130-b may be referred to as a first portion of an access line (e.g., between a memory cell 105 and a sense amplifier 270) and the signal line 265-a may be referred to as a second portion of the access line. The signal development component 260-a may be operable based on various logical signals (e.g., $SW_1$, $SW_2$, $SW_3$, or others), which may be provided by a memory controller (not shown), such as a memory controller 170 described with reference to FIG. 1, or any other component of a memory device 100 that supports access operation timing.

The signal development component 260-a may include a capacitor 410, which may support accumulating, holding, or discharging a charge based on voltages applied across the capacitor 410. Although illustrated as a single component, the capacitor 410 may illustrate a capacitance that is distributed along the signal line 265-a, which may include any quantity of capacitor elements or components distributed along the signal line 265-a, or an intrinsic capacitance of the signal line 265-a. In some examples, the capacitor 410 may be referred to as an integrator capacitor or an amplifier capacitor, and may support a charge transfer sensing functionality of the signal development component 260-a. In the example of the signal development component 260-a, the capacitor 410 may be coupled with or between a line of the signal development component 260-a (e.g., the signal line 265-a) and a voltage source 415 providing a voltage $V_1$ (e.g., a ground voltage source, a variable voltage source).

The signal development component 260-a may also include a transistor 420, configured with a channel portion between the digit line 130-b and the signal line 265-a. A gate of the transistor 420 may be coupled with a voltage source 425 (e.g., a configurable voltage source, a variable voltage source), which may be operable to provide different gate voltages (e.g., $V_{gate}$) for different operating conditions of the transistor 420. For example, the voltage source 425 may be operable to couple the gate of the transistor 420 with a voltage source 455 (e.g., having a voltage $V_{G1}$), or to couple the gate of the transistor 420 with a voltage source 460 (e.g., having a voltage $V_{G2}$), or to couple the gate of the transistor 420 with a voltage source 465 (e.g., having a voltage $V_{G3}$). In some examples, the voltage source 425 may include a switching component 470 that is operable based on a logical signal $SW_3$. In some examples, the transistor 420 may be located outside the illustrative boundaries of the signal development component 260-a, or may be included in a different configuration of a signal development component 260, such as when a signal development component 260 or a capacitor 410 supports signal development for multiple digit lines 130 or memory arrays 110, each of which may be associated with a respective transistor 420.

In some examples, the signal development component 260-a may include circuitry configured to support a selective coupling of the signal line 265-a with a voltage source 435 (e.g., providing a voltage $V_2$). For example, the signal development component 260-a may include a switching component 430 that is operable based on a logical signal $SW_1$. In some examples, the voltage source 435 may be coupled with a relatively high voltage rail or supply, which may support charging or precharging the capacitor 410 (e.g., for developing a cell access signal).

In some examples, the signal development component 260-a may include circuitry configured to support a selective coupling of the digit line 130-b with a voltage source 445 (e.g., providing a voltage $V_3$). For example, the signal development component 260-a may include a switching component 440 that is operable based on a logical signal $SW_2$. In some examples, the voltage source 445 may be coupled with a ground or virtual ground rail or supply. In some examples, the voltage source 445 may be coupled with a same rail or supply as the voltage source 415, or the voltage source 455, or both (e.g., $V_3$ may be equal to one or both of $V_2$ or $V_{G1}$).

In some examples, the signal development component 260-a may include circuitry configured to support a selective coupling (e.g., of the signal line 265-a, of the signal development component 260-a) with another component (e.g., a sense amplifier 270). For example, the signal development component 260-a may include a switching component (not shown) along the signal line 265-a, which may be referred to as an isolation switching component. Additionally or alternatively, an isolation switching component may be included in a sense amplifier 270 in accordance with examples as disclosed herein.

The transistor 420 may support a signal development functionality and a decoding functionality in accordance with examples as disclosed herein. For example, the logical signal $SW_3$ may be controlled based on an operating condition of the signal development component 260-a, such as a type or portion of an access operation, among other conditions, that are being supported by the signal development component 260-a. In some examples, the logical signal $SW_3$ may be controlled to modulate a conductivity of the channel portion of the transistor 420 in accordance with the different operating conditions.

In a first operating condition, the gate of the transistor 420 may be coupled with the voltage source 455 (e.g., biasing the gate with the voltage $V_{G1}$), which may be associated with an isolation of the digit line 130-b from the signal line 265-a (e.g., in an "open" or open circuit mode, in a digital switching mode). In some examples, such operations may be associated with deselecting the digit line 130-b (e.g., to perform an access operation on other digit lines 130 that are selected, or other examples where the memory device is not performing an operation with the digit line 130-b). In some examples, the voltage $V_{G1}$ may be associated with a ground voltage, or another voltage associated with a logic 0 or a deactivation in digital signaling or other logical or switching operations of a memory device 100. In some examples, the voltage $V_{G1}$ may be a negative voltage, which may be associated with a reduced leakage across the transistor 420 (e.g., compared with a ground or zero gate voltage at the transistor 420).

In a second operating condition, the gate of the transistor 420 may be coupled with the voltage source 460 (e.g., biasing the gate with the voltage $V_{G2}$), which may be associated with at least a temporary coupling between the digit line 130-b and the signal line 265-a, including such a coupling in a subthreshold mode (e.g., in a signal development mode, in an analog cascode or voltage control mode).

In some examples, such operations may be associated with selecting the digit line 130-b (e.g., to perform a read operation on the digit line 130-b). In some examples, the second operating condition may support read signal development (e.g., at the signal line 265-a) that is based at least in part on a state stored at a memory cell 105 and a magnitude of the voltage $V_{G2}$. In the second operating condition, the transistor 420 may operate as or be otherwise referred to as a cascode, a voltage controller, a voltage regulator, or a charge transfer sensing amplifier, relating to how the transistor 420 may regulate a flow of charge in response to a change in voltage across the transistor 420 (e.g., between a source node of the transistor 420 and the gate node of the transistor 420). For example, biasing the gate of the transistor 420 with the voltage $V_{G2}$ may throttle or otherwise control a flow of charge (e.g., electrical current) between the digit line 130-b and the signal line 265-a, which may result in signal development for a read operation as described herein. In some examples, the voltage source 460 may be a variable voltage source, such that the voltage $V_{G2}$ is configurable based on various conditions of a memory device 100. For example, the voltage source 460 may be operable to generate the voltage $V_{G2}$ based on a voltage level provided to or by the memory device 100 (e.g., a power supply voltage, a regulated voltage), a temperature of the memory device 100, or a combination thereof, which may support adapting operations of the signal development component 260-a to various process, voltage, or temperature variability between memory devices 100.

In a third operating condition, the gate of the transistor 420 may be coupled with the voltage source 465 (e.g., biasing the gate with the voltage $V_{G3}$), which may be associated with coupling of the digit line 130-b from the signal line 265-a (e.g., in a "closed" or closed circuit mode, in a digital switching mode), which may include such a coupling in a saturation mode. In some examples, such operations may be associated with selecting the digit line 130-b (e.g., to perform a write operation on the digit line 130-b). In some examples, the voltage $V_{G3}$ may have a level associated with a logic 1 or and activation in digital signaling or other logical or switching operations of a memory device 100. In some examples, the voltage $V_{G3}$ may be a relatively large voltage (e.g., greater than $V_{G2}$) that modulates the conductivity of the channel of the transistor 420 to a relatively high value (e.g., a low resistivity). Such a condition may support relatively low impedance or low latency for certain aspects of access operations (e.g., during a write operation).

Figure 5:
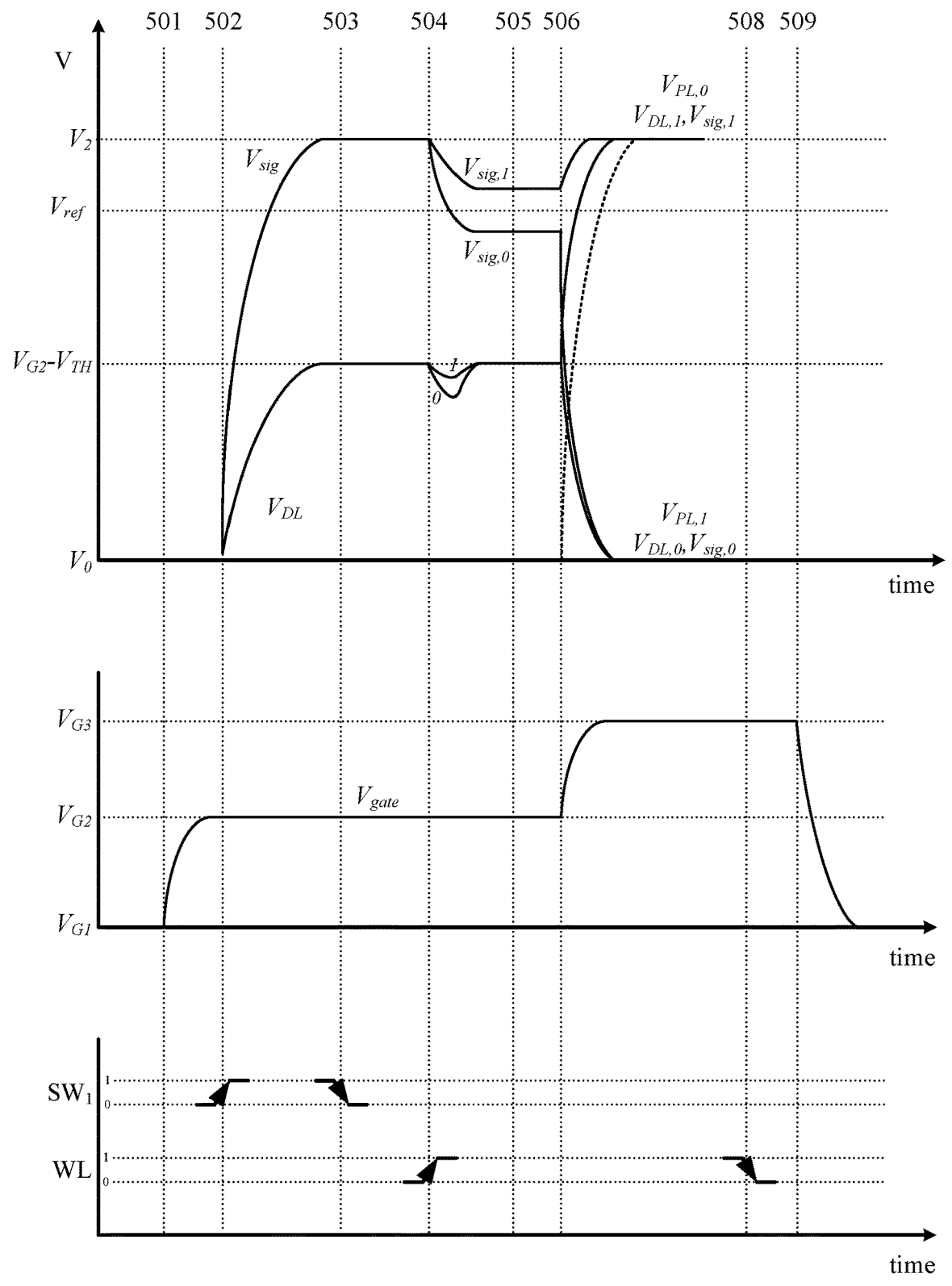
FIG. 5 shows a timing diagram illustrating operations of an example access operation that supports deck-level signal development cascodes in accordance with examples as disclosed herein.

FIG. 5 shows a timing diagram 500 illustrating operations of an example access operation that supports deck-level signal development cascodes in accordance with examples as disclosed herein. The example access procedure is described with reference to components of the example circuits 200 and 400 described with reference to FIG. 2 and FIG. 4. For example, the timing diagram 500 may be associated with an access operation on a memory cell 105, and include reference to a voltage of a digit line 130, $V_{DL}$, a voltage of a plate line 140, $V_{PL}$, and a voltage of a signal line 265, $V_{sig}$. The timing diagram 500 may illustrate biasing of a gate of a transistor 420 during the access operation, using voltages $V_{G1}$, $V_{G2}$, and $V_{G3}$, as well as operation of a switching component 430 (e.g., using a logical signal, $SW_1$) and a cell selection component 230 (e.g., using a word line activation signal, WL).

In some examples, prior to initiating the operations of timing diagram 500, $V_{DL}$ and $V_{PL}$ may be controlled to the same voltage, which may minimize charge leakage across the memory cell 105. In the example of timing diagram 500, $V_{DL}$ and $V_{PL}$ may be controlled to a ground voltage (e.g., $V_0$) but, in some other examples, a plate line 140 and a digit line 130 may be controlled to or otherwise equalized at a different voltage. Moreover, prior to initiating the operations of timing diagram 500, a gate of the transistor 420 may be coupled with the voltage source 455 (e.g., biasing the gate with the voltage $V_{G1}$), which may be associated with a deselection of the digit line 130 or a memory array 110 that includes or is otherwise associated with the digit line 130.

At 501, the access operation may include selecting the digit line 130, or a memory array 110 or deck that includes the digit line 130 (e.g., for an access operation), which may include coupling the gate of the transistor 420 with the voltage source 460 (e.g., biasing the gate with the voltage $V_{G2}$). The operations of 501 may support operating the transistor 420 in a cascode, voltage control, or charge transfer amplification mode to support aspects of read signal development.

At 502, the access operation may include a precharging operation, which may be associated with precharging the signal line 265 or an associated capacitor 410. For example, the logical signal $SW_1$ may be activated, coupling a voltage source 435 with the signal line 265. Accordingly, the voltage of the signal line 265 may rise to the voltage $V_2$ (e.g., a precharge voltage), and charge may be accumulated in the capacitor 410. As a result of the coupling between the signal line 265 and the digit line 130 (e.g., based on the voltage $V_{G2}$ being applied to the gate of the transistor 420), the voltage of the digit line 130 may also rise, until the channel of the transistor 420 opens (e.g., until the conductive path of the transistor 420 is shut). For example, the channel of the transistor 420 may form an open circuit when the voltage at the digit line 130 reaches a value equal to the voltage $V_{G2}$ minus a threshold voltage or activation voltage of the transistor 420 (e.g., a voltage $V_{G2}-V_{TH}$, where $V_{TH}$ may correspond to the threshold or activation voltage of the transistor 420). In other words, the voltage of the digit line 130 may rise until the threshold voltage of the transistor 420 is no longer exceeded. Thus, the voltage of the digit line 130 may rise to a voltage level of $V_{G2}-V_{TH}$ as charge flows between the signal line 265 and the digit line 130 (e.g., as fed by the voltage source 435). In some examples, the voltage level of $V_{G2}-V_{TH}$ may correspond to a read voltage 335 described with reference to FIG. 3B (e.g., a controlled read bias that may be applied across a capacitor 220 of the memory cell 105).

At 503, the access operation may include floating the signal line 265 by isolating the signal line 265 from the voltage source 435 (e.g., deactivating SW1). In some examples, such an isolation may be associated with the capacitor 410 maintaining a stored charge (e.g., a precharge) in accordance with a difference between $V_2$ and $V_1$.

At 504, the access procedure may include selecting a memory cell 105 coupled with the digit line 130, which may include coupling the memory cell 105 with the digit line 130 (e.g., by activating a word line 120 associated with the memory cell 105 via logical signal WL). Such a coupling may be associated with coupling a capacitor 220 of the memory cell 105 with the digit line 130, which may transition the capacitor to a charge state 370 as described with reference to FIG. 3B. Accordingly, charge may be shared between the memory cell 105, the digit line 130, and the signal line 265, which may depend on the state (e.g., logic state, charge state, polarization state) stored at the memory cell 105.

For example, when the memory cell 105 stores a logic 1, the capacitor 220 of the memory cell 105 may store a positive charge by way of a positive polarization (e.g., a charge state 305-a as described with reference to FIG. 3A). Thus, when memory cell 105 storing a logic 1 is selected, a relatively small amount of charge may flow from the digit line 130 to the memory cell 105. As charge flows from the digit line 130 to the memory cell 105, the voltage of the digit line 130 may drop, which may allow the threshold voltage of the transistor 420 to be exceeded. When the threshold voltage of the transistor 420 is exceeded, charge may flow from the signal line 265 (e.g., from the capacitor 410) to the digit line 130 across the transistor 420, as well as a relatively small amount of charge from the voltage source 425, depending on the characteristics of the transistor 420. Accordingly, charge may flow to the digit line 130 until the voltage of the digit line 130 returns to the voltage level equal to $V_{G2}-V_{TH}$. When selecting the memory cell 105 storing a logic 1, because a relatively small amount of charge flows into the memory cell 105, the signal line 265 may undergo a relatively small voltage drop after selecting the memory cell 105, illustrated by the voltage of $V_{sig,1}$.

Alternatively, when the memory cell 105 stores a logic 0, the capacitor 220 of the memory cell 105 may store a negative charge by way of a negative polarization (e.g., charge state 310-a as described with reference to FIG. 3). Thus, when memory cell 105 storing a logic 0 is selected, a relatively large amount of charge may flow from the digit line 130 to the memory cell 105. Accordingly, the signal line 265 may undergo a relatively larger voltage drop, illustrated by the voltage of $V_{sig,0}$, as charge flows through the transistor 420 to return the digit line 130 to the voltage level $V_{G2}-V_{TH}$, such that the threshold voltage $V_{TH}$ of the transistor 420 is no longer exceeded. In some examples, selecting the memory cell 105 storing a logic 0 may result in a reduction or reversal of polarization of the capacitor 220. Thus, selecting a memory cell 105 storing a logic 0 according to the present example may be followed by a subsequent refresh or rewrite operation.

In some examples, the operations of 504 may be associated with the transistor 420 providing a conversion of signals between the digit line 130 and the signal line 265. For example, the transistor 420 may permit a flow of charge (e.g., electrical current) from the signal line 265 (e.g., from the capacitor 410) to the digit line 130, as enabled by the voltage source 425, upon a reduction in voltage of the digit line 130 (e.g., upon selection of the memory cell 105, upon selection of the digit line 130). A relatively small flow of charge to the digit line 130 may be associated with a relatively small change in voltage of the signal line 265, whereas a relatively large flow of charge to the digit line 130 may be associated with a relatively large change in voltage of the signal line 265. According to the net capacitance of the signal line 265 (e.g., including the capacitor 410), for example, the signal line 265 may undergo a relatively small change in voltage or a relatively large change in voltage depending on the flow of charge across the transistor 420 after selecting a memory cell 105.

At 505, the access operation may include determining a logic state stored by the memory cell 105. For example, the logic state may be determined via a comparison between $V_{sig}$ and a reference voltage, $V_{ref}$. For example, $V_{sig,1}$ being higher than $V_{ref}$ may be associated with determining a logic 1, and $V_{sig,0}$ being lower than $V_{ref}$ may be associated with determining a logic 0. In some examples, such a comparison may be provided by a sense amplifier 270, which may latch a result in accordance with one or both of a voltage source 250-b or a voltage source 250-c. In some examples, such a determination may be provided via one or more I/O lines 275.

In some examples, one or more of the operations of 501 through 505 may be associated with performing a read operation, which may be associated with a read operation initiated by a read command from a host device, or from a memory management operation controlled by or otherwise performed by a memory device. In some examples, such a read operation may be followed by a write operation (e.g., a rewrite operation, a refresh operation), which may restore a logic state to a memory cell 105 being read.

At 506, the access operation may include coupling the gate of the transistor 420 with the voltage source 465 (e.g., biasing the gate with the voltage $V_{G3}$). The operations of 506 may support operating the transistor 420 in a closed circuit mode, which may be associated with a relatively higher conductivity or lower impedance than when the gate of the transistor 420 was biased with the voltage $V_{G2}$. In some cases, applying the higher voltage $V_{G3}$ may support relatively faster writing to the memory cell 105.

The operations of 506 may also be associated with applying a write bias across the memory cell 105, which may be based on the logic state to be written to the memory cell. For example, to write a logic 0, the plate line 140 may be biased to a relatively high voltage (e.g., $V_{PL,0}$) and the digit line 130 may be biased to a relatively low voltage (e.g., $V_{DL,0}$), which may correspond to a voltage 325 described with reference to FIG. 3A. In some examples, such a biasing may be associated with biasing the plate line 140 with the voltage source 435 or biasing the digit line 130, the signal line 265, or both with the voltage source 445 (e.g., when a magnitude of the voltage 325 is equal to a magnitude of the read voltage 335), but various other voltage sources or voltage levels may be implemented. In another example, to write a logic 1, the plate line 140 may be biased to a relatively low voltage (e.g., $V_{PL,1}$) and the digit line 130 may be biased to a relatively high voltage (e.g., $V_{DL,1}$), which may correspond to a voltage 315 described with reference to FIG. 3A. However, in the context of a rewrite operation, such biasing may be omitted after reading a logic 1, since the memory cell 105 may maintain the corresponding polarization state after the read operations of 501 through 505. As a result of the biasing of the gate of the transistor 420 with the voltage $V_{G3}$, the voltages of the digit line 130 and the signal line 265 may be substantially equal, or equal within a threshold, which may be supported relatively quickly or efficiently by the channel of the transistor 420 being modulated to a relatively low resistance.

Although described in the context of a rewrite operation, in some examples, the operations of 506 (e.g., a write operation) may be performed without a preceding read operation. For example, a memory device 100 may receive a write command from a host device, or may generate or initiate a write command as part of a memory management operation. In such examples, the biasing of a digit line 130, a plate line 140, a word line 120, and a gate of a transistor 420 may be performed as described with reference to the operations of 506, corresponding to a target logic state for a given memory cell 105.

At 508, the access operation may include deselecting the memory cell 105 coupled with the digit line 130, which may include isolating the memory cell 105 from the digit line 130 (e.g., by deactivating a word line 120 associated with the memory cell 105 via logical signal WL). Such a deselection may be associated with isolating the capacitor 220 of the memory cell 105 from the digit line 130.

At 509, the access operation may include deselecting the digit line 130, or the memory array 110 or deck that includes the digit line 130, which may include coupling the gate of the transistor 420 with the voltage source 455 (e.g., biasing the gate with the voltage $V_{G1}$). In some examples, such a deselection may enable the memory device to perform the operations of 501 through 506 for memory cells 105 located at a different deck.

The order of operations shown in timing diagram 500 is for illustration only, and various other orders and combinations of steps (e.g., in concurrent operation) may be performed to support deck-level signal development cascodes in accordance with the present disclosure. Further, the timing of the operations of timing diagram 500 is also for illustration purposes only, and is not meant to indicate a particular relative duration between one operation and another. Various operations may occur over a duration that is relatively shorter or relatively longer than illustrated in various implementations in accordance with examples as disclosed herein.

The transitions of the logical signals of the timing diagram 500 are illustrative of transitions from one state to another, and generally reflect transitions between an enabled or activated state (e.g., state "0") and a disabled or deactivated state (e.g., state "1") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples a voltage associated with a logical signal may follow a curve over time from one logical state to another. Thus, the transitions shown in timing diagram 500 are not necessarily indicative of an instantaneous transition. Further, the initial state of a logical signal associated with a transition at a numbered operation may have been arrived during various times preceding the numbered operation while still supporting the described transitions and associated operations.

Figure 6:
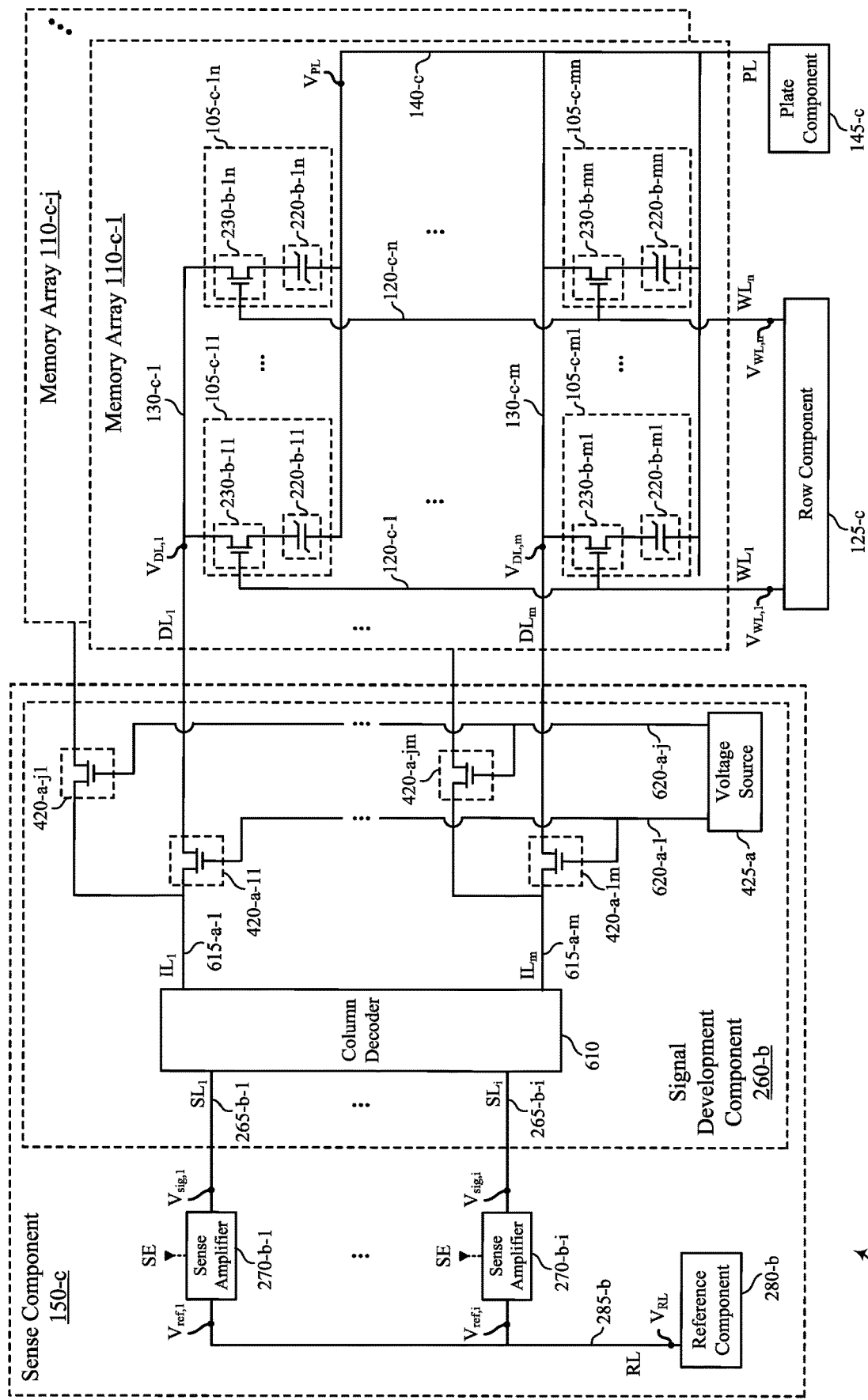
FIG. 6 illustrates an example of a circuit that supports deck-level signal development cascodes in accordance with examples as disclosed herein.

FIG. 6 illustrates an example of a circuit 600 that supports deck-level signal development cascodes in accordance with examples as disclosed herein. The circuit 600 may include a plurality of j memory arrays 110-c (e.g., memory arrays 110-c-1 through 110-c-j), each of which may be associated with a deck (e.g., a level, a vertical position, a height) above a substrate of a memory die. For the sake of illustrative clarity, components of a memory array 110-c are described with reference to a first memory array 110-c-1, but each of the memory arrays 110-c-1 through 110-c-j of the circuit 600 may be associated with respective components or functionality that is similar, different, or some combination thereof. The circuit 600 also includes a sense component 150-c, which may be an example of or include aspects of a sense component 150 as described herein.

The first memory array 110-c-1 may include a set of memory cells 105-c (e.g., memory cells 105-c-11 through 105-c-mn, a set of memory cells 105 associated with the first memory array 110-c-1), which may be arranged according to m columns and n rows. In the example of circuit 600, each of the memory cells 105-c includes a respective capacitor 220-b and a respective cell selection component 230-b (e.g., a cell selection transistor). In some examples, one or more of the capacitors 220-b may be ferroelectric capacitors operable to store a charge or polarization corresponding to a logic state (e.g., for ferroelectric memory cells 105-c, according to a ferroelectric memory architecture). In some examples, memory cells 105-c may include storage elements of different memory architectures, such as linear capacitors (e.g., in a DRAM application), transistors (e.g., in a NAND application, in an SRAM application), or material memory elements (e.g., chalcogenide storage elements, resistive storage elements, thresholding storage elements), among other types of storage elements.

Each of the memory cells 105-c may be coupled with a word line 120-c (e.g., one of word lines 120-c-1 through 120-c-n), a digit line 130-c (e.g., one of digit lines 130-c-1 through 130-c-m), and a plate line 140-c. In some illustrative examples, memory cells 105-c-11 through 105-c-1n may represent a set or column of memory cells 105 coupled with or between a digit line 130 (e.g., digit line 130-c-1) and the plate line 140-c. In some illustrative examples, memory cells 105-c-11 through 105-c-m1 may represent a set or row of memory cells 105 coupled with a word line 120 (e.g., word line 120-c-1). Although the memory array 110-c-1 is illustrated as including a common plate line 140-c for all of the memory cells 105-c, some examples of a circuit 600 may include a separate plate lines 140 for each row of memory cells 105-c (e.g., an independently accessible plate line 140 associated with each of the word lines 120-c) or separate plate lines 140 for each column of memory cells 105-c (e.g., an independently accessible plate line 140 associated with each of the digit lines 130-c), among other configurations.

Each of the word lines 120-c (e.g., each of the word lines $WL_1$ through $WL_n$) may be associated with a respective word line voltage $V_{WL}$ as illustrated, and may be coupled with a row component 125-c (e.g., a row decoder). The row component 125-c may couple one or more of the word lines 120-c with various voltage sources (not shown). In some illustrative examples, the row component 125-c may selectively couple one or more of the word lines 120-c with a voltage source having a relatively high voltage (e.g., a selection voltage, which may be a voltage greater than 0V) or a voltage source having a relatively low voltage (e.g., a deselection voltage, which may be a ground voltage of 0V, or a negative voltage). Each of the digit lines 130-c (e.g., each of the digit lines $DL_1$ through $DL_m$) may be associated with a respective digit line voltage $V_{DL}$ as illustrated, and a memory cell 105-c, or capacitor 220-b or other storage element thereof, may be coupled with a digit line 130-c based at least in part on an activation or activation voltage of an associated word line 120-c.

In some examples, the row component 125-c may be shared among (e.g., coupled with, used for decoding, addressing, or accessing) the memory arrays 110-c-1 through 110-c-j, and an activation of a word line 120-c of the memory array 110-c-1 may or may not be accompanied by a corresponding activation of a word line 120 of one or more of the other memory arrays 110-c (e.g., activating a row in each of the memory arrays 110-c-1 through 110-c-j, activating a row in a subset of the memory arrays 110-c-1 through 110-c-j). For example, each output terminal or node of the row component 125-c may be coupled with a respective word line 120 of each of the memory arrays 110-c-1 through 110-c-j, or some subset thereof, which may include interconnections (e.g., vias, sockets, through-silicon vias (TSVs)) through the decks or levels of a memory device 100 or memory die that includes the circuit 600 to interconnect word lines 120 of the different decks or levels (e.g., of different ones of the memory arrays 110-c).

The plate line 140-c (e.g., plate line PL) may be associated with a plate line voltage $V_{PL}$ as illustrated, and may be coupled with a plate component 145-c (e.g., a plate decoder). The plate component 145-c may couple the plate line 140-c with various voltage sources (not shown). In one example, the plate component 145-c may selectively couple the plate line 140-c with a voltage source having a relatively high voltage (e.g., a plate high voltage, which may be a voltage greater than 0V) or a voltage source having a relatively low voltage (e.g., a plate low voltage, which may be a ground voltage of 0V, or a negative voltage).

In some examples, the plate component 145-c may be shared among (e.g., coupled with, used for decoding, addressing, or accessing) the memory arrays 110-c-1 through 110-c-j, and an activation of the plate line 140-c of the memory array 110-c-1 may or may not be accompanied by a corresponding activation of a plate line 140 of one or more of the other memory arrays 110-c (e.g., activating a common plate in each of the memory arrays 110-c-1 through 110-c-j, activating a common plate in a subset of the memory arrays 110-c-1 through 110-c-j). For example, each output terminal or node of the plate component 145-c may be coupled with a respective plate line 140 of each of the memory arrays 110-c-1 through 110-c-j, or some subset thereof, which may include interconnections (e.g., vias, sockets, TSVs) through the decks or levels of the memory device 100 or memory die that includes the circuit 600 to interconnect plate lines 140 of the different decks or levels. In some examples, one or more plate lines 140 of each of the memory arrays 110-c may be independently addressable, or may be otherwise biased independently from one another by the plate component 145-c.

The sense component 150-c may include various components for accessing (e.g., reading, writing) the memory cells 105-c of the memory arrays 110-c-1 through 110-c-j. For example, the sense component 150-c may include a set of i sense amplifiers 270-b (e.g., sense amplifiers 270-b-1 through 270-b-1) each coupled between a respective signal line 265-b and a reference line 285-b. Each sense amplifier 270-b may include various transistors or amplifiers to detect, convert, or amplify a difference in signals, which may be referred to as latching. For example, a sense amplifier 270-b may include circuit elements that receive and compare a sense signal voltage (e.g., $V_{sig}$) of a respective signal line 265-b with a reference signal voltage (e.g., $V_{ref}$) of the reference line 285-b, which may be provided by a reference component 280-b. An output of a sense amplifier 270-b may be driven to a higher (e.g., a positive) or a lower voltage (e.g., a negative voltage, a ground voltage) based on the comparison at the sense amplifier 270-b.

In some examples, electrical signals associated with such latching may be communicated between the sense component 150-c (e.g., sense amplifiers 270-b) and an input/output component 160, for example, via I/O lines (not shown). In some examples, the sense component 150-c may be in electronic communication with a memory controller (not shown), such as a memory controller 170 described with reference to FIG. 1, which may control various operations of the sense component 150-c. In some examples, activating a logical signal SE may be referred to as "enabling" or "activating" the sense component 150-c or sense amplifiers 270-b thereof. In some examples, activating logical signal SE may be referred to, or be part of an operation known as "latching" the result of accessing memory cells 105-c.

The circuit 600 may implement various techniques for multiplexing the digit lines 130-c with the sense amplifiers 270-b to support accessing the memory cells 105-c. For example, a quantity of sense amplifiers 270-b of the sense component 150-c may be less than a quantity of digit lines 130-c among the memory arrays 110-c-1 through 110-c-j, and certain ones of the digit lines 130-c of the memory arrays 110-c-1 through 110-c-j may be coupled with certain ones of the sense amplifiers 270-b over a given duration for a performing an access operation. In accordance with examples as disclosed herein, the circuit 600 may support such multiplexing using a combination of a column decoder 610 and a voltage source 425-a, which may refer to a distribution or separation of components or functionality of a column component 135 described with reference to FIG. 1.

The column decoder 610 may be configured to support multiplexing or coupling between the i sense amplifiers 270-b or i signal lines 265-b (e.g., signal lines 265-b-1 through 265-b-i, $SL_1$ through $SL_i$) and m intermediate lines 615 (e.g., intermediate lines 615-a-1 through 615-a-m, $IL_1$ through $IL_m$). In some examples, m may be greater than i, such as m being an integer multiple of i. In some examples, m may be equal to a quantity of digit lines 130-c or columns in each of the memory arrays 110-c-1 through 110-c-j. In some examples, the column decoder 610 may illustrate an example of aspects of a column component 135 being integrated with aspects of a sense component 150.

The sense component 150-c may include a signal development component 260-b, which may include aspects of or be an example of signal development components 260 as described herein. For example, the signal development component 260-b may include a voltage source 425-a, which may be an example of a voltage source 425 as described with reference to FIG. 4. In some cases, the voltage source 425-a may be operable to select from among the memory arrays 110-c, which may include a selective coupling or isolation via respective transistors 420-a (e.g., supporting an array selection or decoding functionality, supporting a deck selection or decoding functionality) between intermediate lines 615-a and digit lines 130-c of one or more selected memory arrays 110-c. For example, the voltage source 425-a may couple the gates of the transistors 420-a with a voltage source 455 to provide an isolation between intermediate lines 615-a and digit lines 130-a, or may couple the gates of the transistors 420-a with a voltage source 460 or 465 to provide a coupling between intermediate lines 615-a and digit lines 130-a, where such coupling (e.g., a conductivity of such a coupling, a functionality of such a coupling) may be controlled by a voltage level applied to the gates of the transistors 420-a to support different aspects of access operations.

In some examples, the signal development component 260-b may include one or more capacitors 410 (not shown), which may support a cascode or charge transfer sensing amplification functionality of the signal development component 260-b. In some examples, each of the intermediate lines 615-a may be associated with a respective capacitor 410, which may be associated with a quantity of capacitors 410 in the circuit 600 being equal to a quantity of columns of memory cells 105-c in each memory array 110-c. In some other examples, each of the signal lines 265-b may be associated with a respective capacitor 410, which may be associated with a quantity of capacitors 410 in the circuit 600 being equal to a quantity of sense amplifiers 270-b in the sense component 150-c.

In the example of circuit 600, each memory array 110-c may be associated with a respective row of transistors 420-a, which may be activated using a respective selection line 620 (e.g., a deck selection line, an array selection line). For example, memory array 110-c-1 may be associated with transistors 420-a-11 through 420-a-1m and a selection line 620-a-1, memory array 110-c-j may be associated with transistors 420-a-j1 through 420-a-jm and a selection line 620-a-j, and so on. In some examples, a quantity of memory arrays 110-c and selection lines 620-a (e.g., a quantity j) may be equal to a quantity of decks or levels of the circuit 600 (e.g., of a memory device 100 or a memory die that includes the circuit 600). In some examples (e.g., when multiple memory arrays 110-c are located on a same deck or level), a quantity of memory arrays 110-c and selection lines 620-a may be greater than a quantity of decks or levels (e.g., an integer multiple of decks or levels).

In some examples, when an access operation is to be performed on memory cells 105-c of the memory array 110-c-1, the voltage source 425-a may activate the selection line 620-a-1. Activating the selection line 620-a-1 may activate each of the transistors 420-a-11 through 420-a-1m, thereby coupling the digit lines 130-c-1 through 130-c-m with the column decoder 610 (e.g., via intermediate lines 615-a-1 through 615-a-m). The column decoder 610 may be operable for coupling one or more of the digit lines 130-c-1 through 130-c-m of the selected memory array 110-c-1 with the sense amplifiers 270-b-1 through 270-b-i to support various access operations (e.g., read operations, write operations). Thus, in some such examples, the voltage source 425-a and the transistors 420-a may support an array selection or a deck selection functionality among multiple arrays or decks of a memory device.

In some examples (e.g., during a read operation associated with the memory array 110-c-1), the voltage source 425-a may be operable to couple the digit lines 130-c of the memory array 110-c-1 with the intermediate lines 615-a based on biasing the selection line 620-a-1 with a voltage source 460 (e.g., with a voltage $V_{G2}$), which may include such a coupling in a subthreshold mode (e.g., in a signal development mode, in an analog cascode or voltage control mode). Such operations may support read signal development (e.g., at each of the intermediate lines 615-a or at each of the signal lines 265-b) that is based at least in part on a state stored at a respective memory cell 105-c (e.g., corresponding to an activated word line 120-c) and a magnitude of a voltage on the selection line 620-a-1. In such conditions, each of the transistors 420-a-11 through 420-a-1m may operate as or be otherwise referred to as a respective cascode, voltage controller, voltage regulator, or charge transfer sensing amplifier, relating to how the respective transistor 420-a may regulate a flow of charge in response to a change in voltage across the transistor 420-a (e.g., between a source node of the transistor 420-a and the selection line 620-a-1). Thus, in some such examples, the voltage source 425-a and the transistors 420-a may also support a signal development functionality among multiple arrays or decks of a memory device In some examples (e.g., during a write operation associated with the memory array 110-c-1), the voltage source 425-a may be operable to couple the digit lines 130-c of the memory array 110-c-1 with the intermediate lines 615-a based on biasing the selection line 620-a-1 with a voltage source 465 (e.g., with a voltage $V_{G3}$), which may include such a coupling in a saturation mode (e.g., in a "closed" or closed circuit mode, in a digital switching mode). In some examples, such operations may be associated with selecting the memory array 110-c-1 (e.g., to perform write operations on the memory array 110-c-1). In some examples, the voltage on the selection line 620-a-1 may be a relatively large voltage (e.g., greater than $V_{G2}$) that modulates the conductivity of the respective channel of each of the transistors 420-a to a relatively high value (e.g., a low resistivity), which may support relatively low impedance or low latency for certain aspects of access operations (e.g., during a write operation)

In some examples, when an access operation is to be performed on memory cells 105-c of the memory array 110-c-1, the voltage source 425-a may deactivate other selection lines 620-a (e.g., selection line 620-a-j, among others), which may deactivate each of the other transistors 420-a (e.g., transistors 420-a-j1 through 420-a-jm, among others, in an "open" or open circuit mode, in a digital switching mode), thereby decoupling the digit lines 130 of the other memory arrays 110-c from the column decoder 610 (e.g., from intermediate lines 615-a-1 through 615-a-m). In some examples, such an isolation may improve read margins, power consumption, or other operation of the circuit 600, due to reduced intrinsic capacitance from the perspective of the sense amplifiers 270-b, or reduced charge leakage or dissipation (e.g., via unselected memory arrays 110-c), among other phenomena. Moreover, such isolation may support simplified row decoding (e.g., when word lines 120 of different memory arrays 110-c are coupled with a same or common output of the row component 125-c), since rows of multiple memory arrays 110-c may be activated while only the digit lines 130 of certain selected memory arrays 110-c may be coupled with circuitry supporting a given access operation. In some such examples, the voltage source 425-a may be operable to isolate the digit lines 130 of the other memory arrays 110-c from the intermediate lines 615-a based on biasing the selection line 620-a-j. among others, with a voltage source 455 (e.g., with a voltage $V_{G1}$).

The configuration of components in the circuit 600 may support improved flexibility for layout or formation of a memory device 100 or memory die that includes the circuit 600. For example, the row component 125-c, the plate component 145-c, the sense amplifiers 270-b, the reference component 280-b, the voltage source 425-a, or the column decoder 610, or various combinations thereof, may be formed at least in part by circuitry that is below the memory arrays 110-c, or at least on another deck or level than the memory arrays 110-c. In some examples, such circuitry may be formed at least in part on a substrate (e.g., a crystalline semiconductor portion), and may include various configurations of substrate-based transistor (e.g., transistors formed at least in part by doped portions of a substrate). Such techniques may leverage performance characteristics of crystalline semiconductor materials for such circuitry, which may limit an availability of substrate-based circuitry for other purposes.

In accordance with examples as disclosed herein, the transistors 420-a, among other portions of the circuit 600, may be located above a substrate, including various locations among the decks or levels of the memory arrays 110-c (e.g., distributed among one or more decks or levels of a plurality of decks or levels above the substrate). For example, the transistors 420-a may be formed using thin film fabrication techniques, such as including respective channel portions formed from polycrystalline semiconductor material. In some examples, the transistors 420-a may be formed as vertical transistors (e.g., transistors having a channel portion that is aligned in a height direction relative to a substrate), including various configurations that leverage one or more pillars of channel material having a conductivity that may be modulated (e.g., using the voltage source 425-a) based on a voltage of a respective gate portion. By moving the transistors 420-a above a substrate, the circuit 600 may support improved flexibility for distributing decoding and signal development circuitry throughout a memory die, including such a distribution that leverages the transistors 420-a to combine decoding and signal development functionality, which may improve area utilization, or semiconductor material utilization, among other benefits.

Figure 7:
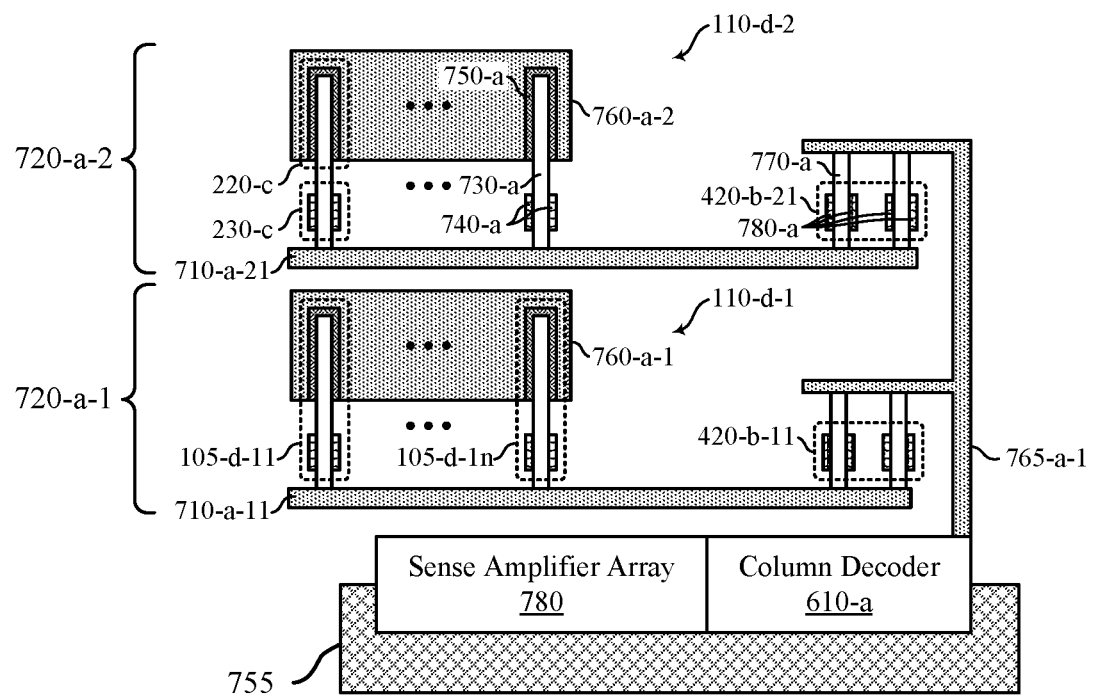
FIG. 7 illustrates an example of a memory structure that supports deck-level signal development cascodes in accordance with examples as disclosed herein.

FIG. 7 illustrates an example of a memory structure 700 that supports deck-level signal development cascodes in accordance with examples as disclosed herein. The memory structure 700 may be illustrative of portions of a memory device 100 or memory die that may be formed with or over a substrate 755. For illustrative purposes, aspects of the memory structure 700 may be described with reference to an x-direction, a y-direction, and a z-direction of a coordinate system 701. The z-direction may be illustrative of a direction perpendicular to a surface of the substrate 755 (e.g., a surface in an xy-plane, a surface upon or over which other materials may be deposited), and each of the related structures, illustrated by their respective cross section in an xz-plane, may extend for some distance, or be repeated for some quantity (e.g., according to a pitch dimension), or both along the y-direction. In some examples, for illustrative purposes, the x-direction may be aligned with or referred to as a column direction (e.g., along a column of memory cells), and the y-direction may be aligned with or referred to as a row direction (e.g., along a row of memory cells 105).

The memory structure 700 illustrates an example of memory arrays 110 associated with different levels 720 (e.g., different decks, a stack of decks, a stack of levels). For example, the memory array 110-d-1 may be associated with a level 720-a-1 at a first height or position relative to the substrate 755, and the memory array 110-d-2 may be associated with a level 720-a-2 at a second (e.g., different) height or position relative to the substrate 755 (e.g., above the level 720-a-1, relative to the substrate 755). Although the memory structure 700 illustrates an example with two levels 720-a, the described techniques may be applied in a memory structure having any quantity of two or more levels 720.

At least some, if not each of the memory arrays 110-d may include a respective set of memory cells 105-d arranged or addressed according to rows (e.g., aligned along the y-direction, addressed according to a position along the x-direction) and columns (e.g., aligned along the x-direction, addressed according to a position along the y-direction). For example, a column of the memory array 110-d-1 may include n memory cells 105-d-11 through 105-d-1n, and may be associated with (e.g., formed upon, formed in contact with, coupled with) a digit line conductor 710-a-11 (e.g., an example of a digit line 130). In some examples, a column of the memory array 110-d-2 may include a same quantity of memory cells 105-d, which may or may not be physically aligned (e.g., along the z-direction) or overlapping (e.g., when viewed in an xy-plane) with the memory cells 105-d of the memory array 110-d-1. A quantity of columns, m, may be formed by repeating the illustrated memory cells 105 and digit line conductors 710-a, among other features, along the y-direction.

At least some, if not each of the memory cells 105-d in the memory structure 700 may include a respective capacitor 220-c and a respective cell selection component 230-c (e.g., a transistor). In the example of memory structure 700, each of the cell selection components 230-c may be formed as a vertical transistor, which may include a channel portion (e.g., a vertical channel) formed at least in part by a respective pillar 730-a, or portion thereof (e.g., along the z-direction), and a gate portion formed at least in part by a respective word line conductor 740-a (e.g., an example of a word line 120). In some examples, the gate portion of a cell selection component 230-c may be a portion or a region of a word line 120 or word line conductor 740-a that is operable to activate the channel portion (e.g., to modulate a conductivity of the channel portion) of the cell selection component 230-c. The word line conductors 740-a may extend from one memory cell 105-d to another memory cell 105-d along a direction, such as the y-direction (e.g., a row direction, along a row of memory cells 105-d), and may be coupled with a row component 125 (not shown) for selecting or activating a row of memory cells 105-d (e.g., by biasing the word line conductors 740-a).

In some examples, word line conductors 740-a of one memory array 110-d (e.g., memory array 110-d-1) may be coupled or connected with word line conductors 740-a of another memory array 110-d (e.g., memory array 110-d-2), such that rows of memory cells 105-d may be commonly activated across multiple memory arrays 110-d or multiple levels 720-a (e.g., by a common node or output of a shared row component 125, not shown). In some examples, interconnections between word line conductors 740-a of different levels 720-a may be formed at least in part along the z-direction by one or more vias, sockets, or TSVs, which may be located at or near a boundary of the memory arrays 110-d (e.g., along the y-direction), among other locations relative to the memory arrays 110-d.

Each capacitor 220-c for a memory cell 105-d may include a respective dielectric portion 750-a formed between a pillar 730-a associated with the memory cell 105-d and a plate conductor 760-a (e.g., an example of a plate line 140, a plate node, or a common plate). In some examples, a portion of a pillar 730-a of a capacitor 220-c may be a same material or combination of materials as a portion of the pillar 730-a of a corresponding cell selection component 230-c (e.g., a doped semiconductor material, a polycrystalline semiconductor). In some examples, a portion of a pillar 730-a of capacitor 220-c may be or include a different material or combination of materials as a portion of the pillar 730-a of a corresponding cell selection component 230-c (e.g., a metal or conductor portion, a metal layer deposited over a surface of the pillar 730-a). In some examples, the dielectric portions 750-a may be formed with a ferroelectric material operable to maintain a non-zero electric charge (e.g., corresponding to a stored logic state) in the absence of an electric field.

In the example of memory structure 700, the memory array 110-d-1 may be associated with (e.g., coupled with, include, be accessed using) a plate conductor 760-a-1 and the memory array 110-d-2 may be associated with (e.g., coupled with, include, be accessed using) a plate conductor 760-a-2. Each of the plate conductors 760-a may be coupled with a plate component 145 (not shown) for biasing the plate conductors 760-a. In the example of memory structure 700, each plate conductor 760-a may be associated with at least a column of memory cells 105-d. In some examples, each of the plate conductors 760-a may also extend along the y-direction along a row of memory cells 105-d, in which case each of the plate conductors 760-a may be associated with all of the memory cells 105-d of a respective memory array 110-b. In some examples, a plate conductor 760-a may be a metal or other conductor formed over or between the dielectric portions 750-a of the memory cells 105-d of the respective memory array 110-d.

In the example of memory structure 700, each column of memory cells 105-d of each memory array 110-d may be associated with a respective transistor 420-b, which may also be formed as a vertical transistor. Each transistor 420-b may be operable to couple a respective digit line conductor 710-a with an intermediate line conductor 765-a (e.g., an example of an intermediate line 615). In the example of memory structure 700, each intermediate line conductor 765-*a* may be a combination of horizontal metal layers formed in contact with (e.g., above, opposite the digit line conductors 710-*a*) the pillars 770-*a* and a vertical portion coupled with the column decoder 610-*a* that may be formed by one or more vias, sockets, or TSVs. In the example of memory structure 700, to support m columns per memory array 110-*d*, m intermediate line conductors 765-*a* may be formed along the y-direction, and each intermediate line conductor 765-*a* may be coupled or connected with a transistor 420-*b* of each memory array 110-*d* or each level 720-*a* (e.g., intermediate line conductor 765-*a*-1 being coupled with transistors 420-*b*-11 and 420-*b*-21).

At least some, if not each transistor 420-*b* may include a channel portion (e.g., a vertical channel) formed at least in part by one or more respective pillars 770-*a* and a gate portion formed at least in part by one or more respective deck selection conductors 780-*a* (e.g., an example of a selection line 620). In some examples, the gate portion of a transistor 420-*b* may be a portion or a region of a selection line 620 that is operable to activate the channel portion (e.g., to modulate a conductivity of the channel portion) of the transistor 420-*b*. The conductors 780-*a* may extend from one column of memory cells 105-*d* to another, or from one transistor 420-*b* to another, along a direction, such as the y-direction (e.g., along a row direction, along a row of memory cells 105), and may be coupled with a voltage source 425 (not shown) for selecting or activating a memory array 110-*d* (e.g., by biasing the conductors 780-*a*, by activating a row of transistors 420-*b*).

For example, in a first operating condition, the conductors 780-*a* may be coupled with a voltage $V_{G1}$ (e.g., a ground voltage or negative voltage, a switching deactivation voltage), which may isolate corresponding digit line conductors 710-*a* from intermediate line conductors 765-*a*. In some examples, in a second operating condition, the conductors 780-*a* may be coupled with a voltage $V_{G2}$ (e.g., a gate voltage associated with signal development or other aspects of a read operation, a gate voltage associated with operation at least in part in a subthreshold mode), which may couple corresponding digit line conductors 710-*a* with intermediate line conductors 765-*a*. In some examples, in a third operating condition, the conductors 780-*a* may be coupled with a voltage $V_{G3}$ (e.g., a switching activation voltage, a gate voltage associated with aspects of a write operation, a gate voltage associated with operation in a saturation mode), which may couple corresponding digit line conductors 710-*a* with intermediate line conductors 765-*a*.

The set of m intermediate line conductors 765-*a* may be coupled with a column decoder 610-*a*, which may, in turn, be coupled with a sense amplifier array 780 (e.g., an array of sense amplifiers 270, via a plurality of signal lines 265). Accordingly, a combination of a voltage source 425 (not shown) and the column decoder 610-*a*, may be used to multiplex, address, or otherwise selectively couple the digit line conductors 710-*a* of the memory arrays 110-*d*-1 and 110-*d*-2 with the sense amplifier array 780, or sense amplifiers 270 thereof, to support various access operations. In some examples, circuitry of the voltage source 425, the column decoder 610-*a*, or the sense amplifier array 780 may be substrate-based, such as including transistors formed at least in part by a doped portion of the substrate 755. By including the transistors 420-*b* in locations above the substrate 755, the memory structure 700 may support improved flexibility for distributing decoding and signal development circuitry throughout a memory die, which may improve area utilization, or semiconductor material utilization, among other benefits.

In various examples, each of the pillars 730 and 770 may be operable to support at least a portion of a channel of a respective transistor (e.g., a channel or operable conductive path aligned along the z-direction, supporting an electrical coupling or conductive path between source and drain terminals based at least in part on a voltage of a respective gate portion, gate terminal, or gate conductor), and may include one or more doped semiconductor portions. For example, to support an n-type transistor, a pillar 730 or a pillar 770 may include at least a p-type semiconductor portion, or may include a stack (e.g., in the z-direction) of an n-type semiconductor, a p-type semiconductor, and an n-type semiconductor (e.g., in an NPN arrangement along the z-direction), among other constituent materials or arrangements. To support a p-type transistor, a pillar 730 or a pillar 770 may include at least an n-type semiconductor portion, or may include a stack (e.g., along the z-direction) of a p-type semiconductor, an n-type semiconductor, and a p-type semiconductor (e.g., in an PNP arrangement in the z-direction), among other constituent materials or arrangements. In some examples, a pillar as described herein (e.g., a pillar 730, a pillar 770) may include one or more electrodes or electrode portions, such as an electrode at one or both ends of the pillar (e.g., a top end, a bottom end, or both).

Each of the pillars 730 and 770 may be associated with a height or a height dimension relative to the substrate (e.g., a lower extent in the z-direction, an upper extent in the z-direction, a span in the z-direction), which may be defined as part of balancing various performance criteria of the memory arrays 110. In some examples, a height dimension or extent in the z-direction of the pillars 730 of a memory array 110 may be the same as or at least partially overlapping with a height dimension or extent in the z-direction of the pillars 770 of the memory array 110. For example, each of the pillars 730 and 770 may have a common height dimension (e.g., a common upper extent, a common lower extent, or both) relative to the substrate. In some examples, the pillars 730 may have a height or a height dimension that is different than the pillars 770, such as the pillars 730 having an extended height along the z-direction to support one or more features of the capacitors 220. The pillars 730 and 770 may be formed with various cross-sectional shapes (e.g., in an xy-plane), such as a square shape, a rectangular shape, a circular shape, an oval shape, or a polygonal shape, among others, where pillars 730 and 770 may have common or different shapes, or common or different dimensions.

The pillars 730 and 770 may be formed according to various techniques. In some examples, one or more layers or stacks of layers of doped semiconductor material may be deposited on or above a substrate (e.g., on or in contact with a digit line conductor 710, or corresponding metal layer), and portions of the deposited layers located between respective pillars 730 and 770 (e.g., along the x-direction, along the y-direction) may be etched away or trenched to form the respective pillars. In some examples, pillars 730 and 770 may be formed from the same material or combination of materials (e.g., from a same layer or stack of layers). In some examples, such layers may include one or more electrode layers, such as an electrode layer above a stack of doped semiconductor material layers, an electrode layer below a stack of doped semiconductor material layers, or both, and such electrode layers may be or may not be etched or trenched along with the pillar formation processes. Additionally or alternatively, in some examples, holes or trenches may be etched through a material (e.g., in the z-direction, through a dielectric material, through a gate dielectric material) and material for the pillars 730 and 770 (e.g., one or more doped semiconductor materials, one or more electrode materials) may be deposited in the etched holes or trenches. In examples where pillar material is deposited into holes, trenches, or other recesses, pillars 730 and 770 may or may not be formed from a same material or combination of materials.

In various examples, a quantity or configuration of pillars 730 and 770 for a respective transistor may be defined or chosen for particular characteristics, such as an associated drive strength (e.g., drive current), impedance, activation threshold, or leakage characteristic of a particular transistor or set of transistors. In some examples, multiple pillars 730 or multiple pillars 770 may be described as or configured as parallel physical structures (e.g., parallel channels) of a common transistor or transistor component. For example, as illustrated, each of the transistors 420-b may include or be otherwise formed with two pillars 770-a. However, in other examples, a transistor 420 or a cell selection component 230 may include or be otherwise formed with any quantity of one or more pillars 770 or 730, respectively. Likewise, in various examples, a capacitor 220 may be formed with or over any quantity of one or more pillars 730. In some examples, each pillar 730 or 770 of a set that is configured in parallel (e.g., commonly activated) may be described as or configured as a component of single transistor, such that a corresponding cell selection or deck selection may be described as or configured as having multiple transistors in a parallel arrangement.

In some examples, word line conductors 740 and conductors 780 of a given memory array 110 may be formed using one or more common operations, one or more common materials, or otherwise share various aspects of formation or configuration. For example, word line conductors 740 and conductors 780 may be formed using one or more common conductor formation processes (e.g., a common masking process, a common etching process, a common deposition process, or various combinations thereof). In some examples, word line conductors 740 and conductors 780 may be formed with a height dimension that is within or overlapping with a height dimension of at least doped semiconductor portions of the pillars 730 and 770 (e.g., supporting the function of modulating a conductivity through channel portions of the cell selection components 730 and transistors 780, respectively).

In various examples, word line conductors 740 and conductors 780 may be formed from a metal or metal alloy (e.g., copper, tungsten, gold, silver, tin, aluminum, or alloys thereof). Such conductors may be separated from pillars 730 or 770 (along the x-direction, along the y-direction, along the x-direction and the y-direction, in a radial direction) by a gate dielectric that is in contact with portions of the conductor and the respective pillar. In some examples, gate conductors may be located alongside the respective pillars (e.g., as a transverse gate, as a pass-by gate, as a pair of gate conductors on either or both sides of a pillar), including conductors extending between the pillars along the y-direction and separated from pillars along the x-direction by a gate dielectric. In some examples, gate conductors may include at least a portion that wraps (e.g., partially, entirely) around respective pillars (e.g., as a wrap-around gate, as a circumferential gate, as an all-around gate), where at least the respective pillars a may be wrapped (e.g., partially wrapped, entirely wrapped) with a circumferential gate dielectric that is in contact with the pillar and the conductor. In various examples, the digit line conductors 710 or intermediate line conductors 765, among other components such as conductors, may be formed from a metal or metal alloy, which may be a same material or a different material as conductors used to support transistor gate portions (e.g., word line conductors 740, conductors 780).

Figure 8:
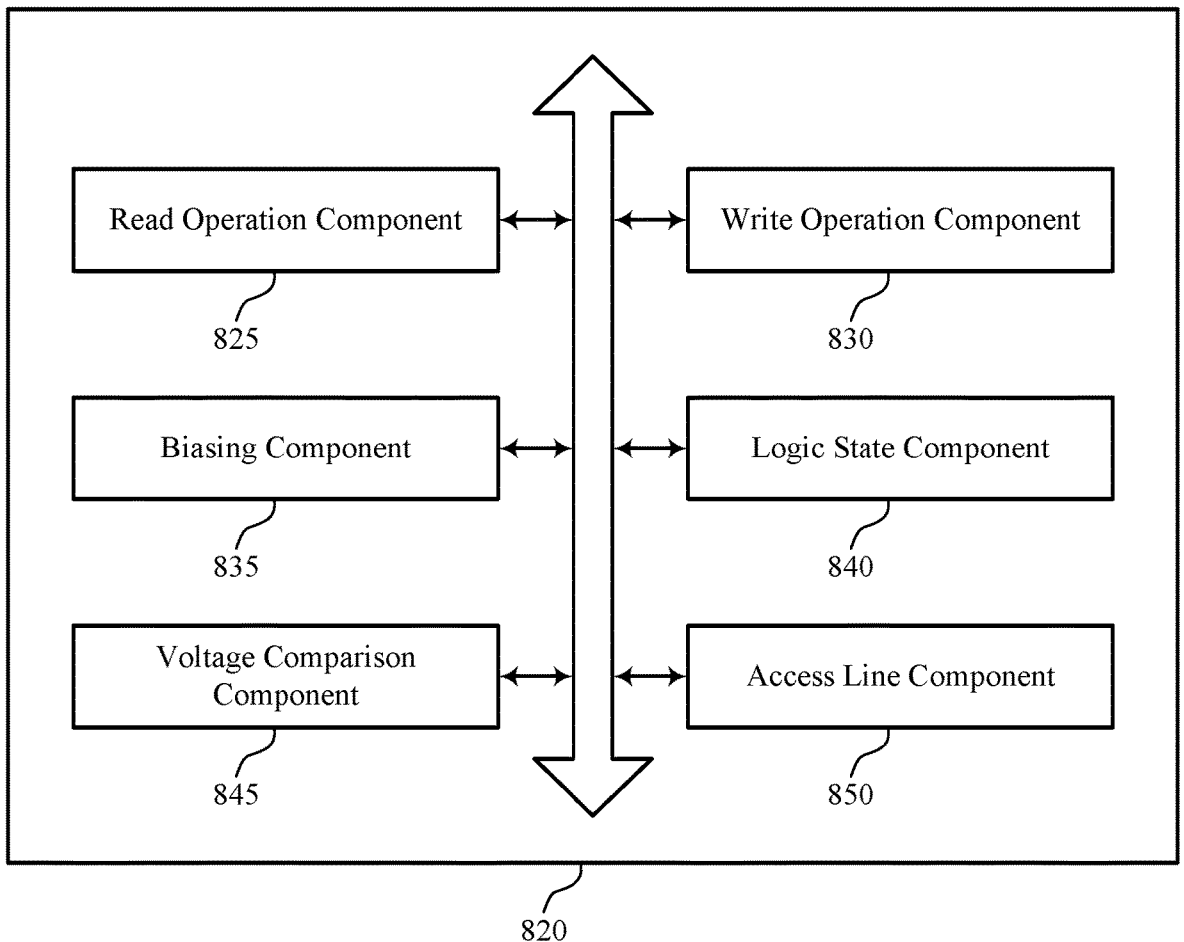
FIG. 8 shows a block diagram of a memory device that supports deck-level signal development cascodes in accordance with examples as disclosed herein.

FIG. 8 shows a block diagram 800 of a memory device 820 that supports deck-level signal development cascodes in accordance with examples as disclosed herein. The memory device 820 may be an example of aspects of a memory device as described with reference to FIGS. 1 through 7. The memory device 820, or various components thereof, may be an example of means for performing various aspects of deck-level signal development cascodes as described herein. For example, the memory device 820 may include a read operation component 825, a write operation component 830, a biasing component 835, a logic state component 840, a voltage comparison component 845, an access line component 850, or any combination thereof. Each of these components may communicate, directly or indirectly, with one another (e.g., via one or more buses).

The read operation component 825 may be configured as or otherwise support a means for performing a read operation on a memory cell. In some examples, to support the read operation, the access line component 850 may be configured as or otherwise support a means for coupling the memory cell with a first portion of an access line, coupling a sense component with a second portion of the access line, coupling the first portion of the access line with the second portion of the access line based at least in part on biasing a gate of a transistor with a first voltage, or any combination thereof. The write operation component 830 may be configured as or otherwise support a means for performing a write operation on the memory cell. In some examples, to support the write operation, the access line component 850 may be configured as or otherwise support a means for coupling the first portion of the access line with the second portion of the access line based at least in part on biasing the gate of the transistor with a second voltage that is higher than the first voltage.

In some examples, the biasing component 835 may be configured as or otherwise support a means for biasing the gate of the transistor with the first voltage, where biasing the gate of the transistor with the first voltage is associated with operating the transistor in a subthreshold mode. In some examples, the biasing component 835 may be configured as or otherwise support a means for biasing the gate of the transistor with the second voltage, where biasing the gate of the transistor with the second voltage is associated with operating the transistor in a saturation mode.

In some examples, to support the read operation, the read operation component 825 may be configured as or otherwise support a means for generating a voltage of the second portion of the access line based at least in part on a logic state stored by the memory cell and the biasing of the gate of the transistor with the first voltage.

In some examples, to support the read operation, the voltage comparison component 845 may be configured as or otherwise support a means for comparing the voltage of the second portion of the access line with a reference voltage. In some examples, to support the read operation, the logic state component 840 may be configured as or otherwise support a means for identifying a logic value of the memory cell based at least in part on the comparison.

In some examples, to support generating the voltage of the second portion of the access line, the read operation component 825 may be configured as or otherwise support a means for controlling a voltage of the first portion of the access line based at least in part on biasing the gate of the transistor with the first voltage.

In some examples, to support the read operation, the read operation component 825 may be configured as or otherwise support a means for precharging a capacitor coupled with the second portion of the access line. In some examples, to support the read operation, the read operation component 825 may be configured as or otherwise support a means for controlling the voltage of the first portion of the access line based at least in part on discharging the capacitor across the transistor after the precharging.

In some examples, the logic state component 840 may be configured as or otherwise support a means for identifying, during the read operation, a logic state stored by the memory cell based at least in part on biasing the gate of the transistor with the first voltage, and the write operation may include writing (e.g., in a rewrite operation) the identified logic state to the memory cell based at least in part on biasing the gate of the transistor with the second voltage.

Figure 9:
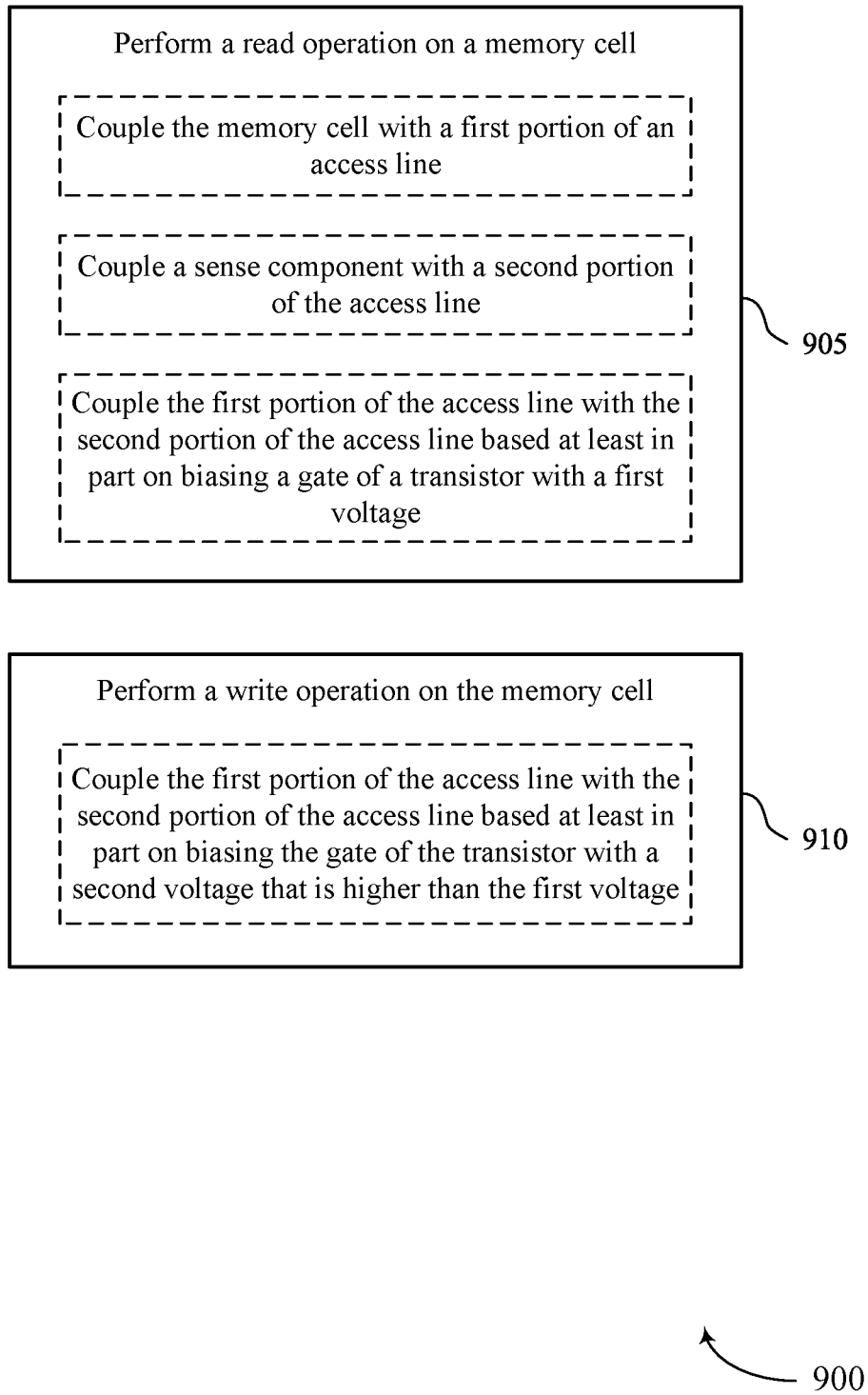
FIG. 9 shows a flowchart illustrating a method or methods that support deck-level signal development cascodes in accordance with examples as disclosed herein.

FIG. 9 shows a flowchart illustrating a method 900 that supports deck-level signal development cascodes in accordance with examples as disclosed herein. The operations of method 900 may be implemented by a memory device or its components as described herein. For example, the operations of method 900 may be performed by a memory device as described with reference to FIGS. 1 through 8. In some examples, a memory device may execute a set of instructions to control the functional elements of the device to perform the described functions. Additionally or alternatively, the memory device may perform aspects of the described functions using special-purpose hardware.

At 905, the method may include performing a read operation on a memory cell. In some examples, the read operation may include coupling the memory cell with a first portion of an access line, coupling a sense component with a second portion of the access line, and coupling the first portion of the access line with the second portion of the access line based at least in part on biasing a gate of a transistor with a first voltage. The operations of 905 may be performed in accordance with examples as disclosed herein. In some examples, aspects of the operations of 905 may be performed by a read operation component 825 as described with reference to FIG. 8.

At 910, the method may include performing a write operation on the memory cell (e.g., before or after performing the read operation of 905). In some examples, the write operation may include coupling the first portion of the access line with the second portion of the access line based at least in part on biasing the gate of the transistor with a second voltage that is higher than the first voltage. The operations of 910 may be performed in accordance with examples as disclosed herein. In some examples, aspects of the operations of 910 may be performed by a write operation component 830 as described with reference to FIG. 8.

In some examples, an apparatus as described herein may perform a method or methods, such as the method 900. The apparatus may include operations, features, circuitry, logic, means, or instructions (e.g., a non-transitory computer-readable medium storing instructions executable by a processor) for performing a read operation on a memory cell, where the read operation may include coupling the memory cell with a first portion of an access line, coupling a sense component with a second portion of the access line, and coupling the first portion of the access line with the second portion of the access line based at least in part on biasing a gate of a transistor with a first voltage. The apparatus may include operations, features, circuitry, logic, means, or instructions (e.g., a non-transitory computer-readable medium storing instructions executable by a processor) for performing a write operation on the memory cell, where the write operation may include coupling the first portion of the access line with the second portion of the access line based at least in part on biasing the gate of the transistor with a second voltage that is higher than the first voltage.

In some examples of the method 900 and the apparatus described herein, biasing the gate of the transistor with the first voltage may be associated with operating the transistor in a subthreshold mode, and biasing the gate of the transistor with the second voltage may be associated with operating the transistor in a saturation mode.

In some examples of the method 900 and the apparatus described herein, performing the read operation may include operations, features, circuitry, logic, means, or instructions for generating a voltage of the second portion of the access line based at least in part on a logic state stored by the memory cell and the biasing of the gate of the transistor with the first voltage.

In some examples of the method 900 and the apparatus described herein, performing the read operation may include operations, features, circuitry, logic, means, or instructions for comparing the voltage of the second portion of the access line with a reference voltage and identifying a logic value of the memory cell based at least in part on the comparison.

In some examples of the method 900 and the apparatus described herein, generating the voltage of the second portion of the access line may include operations, features, circuitry, logic, means, or instructions for controlling a voltage of the first portion of the access line based at least in part on biasing the gate of the transistor with the first voltage.

In some examples of the method 900 and the apparatus described herein, performing the read operation may include operations, features, circuitry, logic, means, or instructions for precharging a capacitor coupled with the second portion of the access line and controlling the voltage of the first portion of the access line based at least in part on discharging the capacitor across the transistor after the precharging.

Some examples of the method 900 and the apparatus described herein may further include operations, features, circuitry, logic, means, or instructions for identifying, during the read operation, a logic state stored by the memory cell based at least in part on biasing the gate of the transistor with the first voltage, and the write operation may include writing the identified logic state to the memory cell based at least in part on biasing the gate of the transistor with the second voltage.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory cell operable to couple with a first portion of an access line, a sense component operable to couple with a second portion of the access line, and a transistor having a channel portion between the first portion of the access line and the second portion of the access line. The apparatus may include circuitry operable to bias a gate portion of the transistor with a first voltage for isolating the first portion of the access line from the second portion of the access line, bias the gate portion of the transistor with a second voltage for coupling the first portion of the access line with the second portion of the access line during a read operation on the memory cell, and bias the gate portion of the transistor with a third voltage, greater than the second voltage, for coupling the first portion of the access line with the second portion of the access line during a write operation on the memory cell.

In some examples, biasing the gate portion of the transistor with the second voltage may be associated with operating the transistor in a subthreshold mode during the read operation, and biasing the gate portion of the transistor with the third voltage may be associated with operating the transistor in a saturation mode during the write operation.

In some examples, the circuitry may be operable to generate, during the read operation, a voltage of the second portion of the access line based at least in part on a logic state stored at the memory cell and the biasing of the gate portion of the transistor with the second voltage.

In some examples, to generate the voltage of the second portion of the access line, the circuitry may be operable to control a voltage of the first portion of the access line based at least in part on biasing the gate portion of the transistor with the second voltage.

In some examples, the apparatus may further include a capacitor coupled with the second portion of the access line, and the circuitry may be operable to precharge the capacitor in accordance with a fourth voltage that is greater than the second voltage and control the voltage of the first portion of the access line based at least in part on discharging the capacitor across the transistor after the precharging.

In some examples, the circuitry may be operable to identify, during the read operation, a logic state stored by the memory cell based at least in part on biasing the gate portion of the transistor with the second voltage. In some examples of the apparatus, the circuitry may be operable to write, during the write operation and in response to the read operation, the identified logic state to the memory cell based at least in part on biasing the gate portion of the transistor with the third voltage.

Another apparatus is described. The apparatus may include a plurality of memory cells, each memory cell of the plurality of memory cells associated with a respective first transistor that is operable to couple a storage component of the memory cell with a first portion of an access line, and each first transistor may include a respective first channel portion formed with a respective set of one or more first semiconductor pillars. The apparatus may include a second transistor operable to couple the first portion of the access line with a second portion of the access line, and the second transistor may include a second channel portion formed with a set of one or more second semiconductor pillars overlapping, along a height dimension relative to a substrate, with the first semiconductor pillars. The apparatus may include a voltage source operable to control a voltage of the first portion of the access line, during a read operation, in accordance with a voltage applied to a gate portion of the second transistor during the read operation. The apparatus may include a sense component operable to sense a logic state of a selected memory cell of the plurality of memory cells based at least in part on a voltage of the second portion of the access line that is associated with the controlling, during the read operation, of the voltage of the first portion of the access line.

In some examples, the voltage source may be operable to control the voltage of the first portion of the access line in accordance with a difference between the voltage applied to the gate portion of the second transistor and a threshold voltage associated with the second transistor.

In some examples, the apparatus may include a capacitance associated with the second portion of the access line, and the voltage source may be operable to control the voltage of the first portion of the access line based at least in part on the capacitance associated with the second portion of the access line.

In some examples, the sense component may be operable to sense the logic state based at least in part on an amount of discharge of the capacitance associated with the second portion of the access line.

In some examples, the voltage source may be operable to couple the first portion of the access line with the second portion of the access line, during a write operation, based at least in part on biasing the gate portion of the second transistor with a second voltage that is greater than the voltage applied to a gate portion of the second transistor during the read operation.

In some examples, applying the voltage to the gate portion of the second transistor during the read operation may be associated with operating the second transistor in a subthreshold mode, and applying the second voltage to the gate portion of the second transistor during the write operation may be associated with operating the second transistor in a saturation mode.

In some examples, the voltage source may be operable to apply the second voltage to the gate portion of the first transistor during the read operation and apply the second voltage to the gate portion of the first transistor during the write operation.

In some examples of the apparatus, the set of one or more second semiconductor pillars may be associated with a greater quantity of pillars than the respective sets of one or more first semiconductor pillars.

In some examples, the apparatus may include a second plurality of memory cells, each memory cell of the second plurality of memory cells associated with a respective third transistor that may be operable to couple a storage component of the memory cell with a first portion of a second access line, and each third transistor may include a respective third channel portion formed with a respective set of one or more third semiconductor pillars. In some examples, the apparatus may include a fourth transistor operable to couple the first portion of the second access line with a second portion of the second access line, and the fourth transistor may include a fourth channel portion formed with a set of one or more fourth semiconductor pillars overlapping, along the height dimension relative to a substrate, with the third semiconductor pillars. In some examples, the voltage source may be operable to isolate, during the read operation, the first portion of the second access line from the second portion of the second access line based at least in part on applying a third voltage to the gate portion of the fourth transistor.

In some examples of the apparatus, the plurality of memory cells, the respective first transistors, and the second transistor may be associated with a first deck of the apparatus having a first distance from the substrate. In some examples of the apparatus, the second plurality of memory cells, the respective third transistors, and the fourth transistor may be associated with a second deck of the apparatus having a second distance from the substrate.

In some examples of the apparatus, the third voltage may correspond to a ground voltage.

In some examples, the voltage source may be operable to generate the voltage applied to the gate portion of the second transistor based at least in part on a level of a voltage provided to the apparatus, a temperature of the apparatus, or a combination thereof.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a memory cell operable to couple with a first portion of an access line;
   a sense component operable to couple with a second portion of the access line;
   a transistor having a channel portion between the first portion of the access line and the second portion of the access line; and
   circuitry operable to:
      bias a gate portion of the transistor with a first voltage for isolating the first portion of the access line from the second portion of the access line;
      bias the gate portion of the transistor with a second voltage for coupling the first portion of the access line with the second portion of the access line during a read operation on the memory cell wherein, while biasing the gate portion of the transistor with the second voltage during the read operation, charge flows between the second portion of the access line and the first portion of the access line across the transistor until a voltage of the first portion of the access line is within a threshold difference of the second voltage; and
      bias the gate portion of the transistor with a third voltage, greater than the second voltage, for coupling the first portion of the access line with the second portion of the access line during a write operation on the memory cell.

2. The apparatus of claim 1, wherein:
   biasing the gate portion of the transistor with the second voltage is associated with operating the transistor in a subthreshold mode during the read operation; and
   biasing the gate portion of the transistor with the third voltage is associated with operating the transistor in a saturation mode during the write operation.

3. The apparatus of claim 1, wherein the circuitry is operable to:
   generate, during the read operation, a voltage of the second portion of the access line based at least in part on an amount of the charge that flows between the second portion of the access line and the first portion of the access line across the transistor, the amount of the charge being based at least in part on a logic state stored at the memory cell.

4. The apparatus of claim 3, further comprising:
   a capacitor coupled with the second portion of the access line, wherein the circuitry is operable to:
      precharge the capacitor in accordance with a fourth voltage that is greater than the second voltage; and
      control the voltage of the first portion of the access line based at least in part on discharging the capacitor across the transistor after the precharging.

5. The apparatus of claim 1, wherein the circuitry is operable to:
   identify, during the read operation, a logic state stored by the memory cell based at least in part on biasing the gate portion of the transistor with the second voltage; and
   write, during the write operation and in response to the read operation, the identified logic state to the memory cell based at least in part on biasing the gate portion of the transistor with the third voltage.

6. A method, comprising:
   performing a read operation on a memory cell, wherein the read operation comprises:
      coupling the memory cell with a first portion of an access line;
      coupling a sense component with a second portion of the access line; and
      coupling the first portion of the access line with the second portion of the access line during the read operation based at least in part on biasing a gate of a transistor with a first voltage wherein, while biasing the gate of the transistor with the first voltage during the read operation, charge flows between the second portion of the access line and the first portion of the access line across the transistor until a voltage of the first portion of the access line is within a threshold difference of the first voltage; and
   performing a write operation on the memory cell, wherein the write operation comprises:
      coupling the first portion of the access line with the second portion of the access line based at least in part on biasing the gate of the transistor with a second voltage that is higher than the first voltage.

7. The method of claim 6, wherein:
   biasing the gate of the transistor with the first voltage is associated with operating the transistor in a subthreshold mode; and
   biasing the gate of the transistor with the second voltage is associated with operating the transistor in a saturation mode.

8. The method of claim 6, wherein the read operation comprises:
generating a voltage of the second portion of the access line based at least in part on an amount of the charge that flows between the second portion of the access line and the first portion of the access line across the transistor, the amount of the charge being based at least in part on a logic state stored by the memory cell.

9. The method of claim 8, wherein the read operation comprises:
comparing the voltage of the second portion of the access line with a reference voltage; and
identifying a logic value of the memory cell based at least in part on the comparison.

10. The method of claim 9, wherein the read operation comprises:
precharging a capacitor coupled with the second portion of the access line; and
controlling the voltage of the first portion of the access line based at least in part on discharging the capacitor across the transistor after the precharging.

11. The method of claim 6, further comprising:
identifying, during the read operation, a logic state stored by the memory cell based at least in part on biasing the gate of the transistor with the first voltage, wherein the write operation comprises writing the identified logic state to the memory cell based at least in part on biasing the gate of the transistor with the second voltage.

12. An apparatus, comprising:
a plurality of memory cells, each memory cell of the plurality of memory cells associated with a respective first transistor that is operable to couple a storage component of the memory cell with a first portion of an access line, wherein each first transistor comprises a respective first channel portion formed with a respective set of one or more first semiconductor pillars;
a second transistor operable to couple the first portion of the access line with a second portion of the access line, the second transistor comprising a second channel portion formed with a set of one or more second semiconductor pillars overlapping, along a height dimension relative to a substrate, with the first semiconductor pillars;
a voltage source operable to control a voltage of the first portion of the access line, during a read operation, in accordance with a voltage applied to a gate portion of the second transistor during the read operation; and
a sense component operable to sense a logic state of a selected memory cell of the plurality of memory cells based at least in part on a voltage of the second portion of the access line that is associated with the controlling, during the read operation, of the voltage of the first portion of the access line.

13. The apparatus of claim 12, wherein the voltage source is operable to:
control the voltage of the first portion of the access line in accordance with a difference between the voltage applied to the gate portion of the second transistor and a threshold voltage associated with the second transistor.

14. The apparatus of claim 12, further comprising:
a capacitance associated with the second portion of the access line, wherein the voltage source is operable to control the voltage of the first portion of the access line based at least in part on the capacitance associated with the second portion of the access line.

15. The apparatus of claim 14, wherein the sense component is operable to:
sense the logic state based at least in part on an amount of discharge of the capacitance associated with the second portion of the access line.

16. The apparatus of claim 12, wherein the voltage source is operable to:
couple the first portion of the access line with the second portion of the access line, during a write operation, based at least in part on biasing the gate portion of the second transistor with a second voltage that is greater than the voltage applied to a gate portion of the second transistor during the read operation.

17. The apparatus of claim 16, wherein applying the voltage to the gate portion of the second transistor during the read operation is associated with operating the second transistor in a subthreshold mode, and applying the second voltage to the gate portion of the second transistor during the write operation is associated with operating the second transistor in a saturation mode.

18. The apparatus of claim 16, wherein the voltage source is operable to:
apply the second voltage to the gate portion of the first transistor during the read operation; and
apply the second voltage to the gate portion of the first transistor during the write operation.

19. The apparatus of claim 12, wherein the set of one or more second semiconductor pillars is associated with a greater quantity of pillars than the respective sets of one or more first semiconductor pillars.

20. The apparatus of claim 12, further comprising:
a second plurality of memory cells, each memory cell of the second plurality of memory cells associated with a respective third transistor that is operable to couple a storage component of the memory cell with a first portion of a second access line, wherein each third transistor comprises a respective third channel portion formed with a respective set of one or more third semiconductor pillars; and
a fourth transistor operable to couple the first portion of the second access line with a second portion of the second access line, the fourth transistor comprising a fourth channel portion formed with a set of one or more fourth semiconductor pillars overlapping, along the height dimension relative to the substrate, with the third semiconductor pillars,
wherein the voltage source is operable to isolate, during the read operation, the first portion of the second access line from the second portion of the second access line based at least in part on applying a third voltage to the gate portion of the fourth transistor.

21. The apparatus of claim 20, wherein:
the plurality of memory cells, the respective first transistors, and the second transistor are associated with a first deck of the apparatus having a first distance from the substrate; and
the second plurality of memory cells, the respective third transistors, and the fourth transistor are associated with a second deck of the apparatus having a second distance from the substrate.

22. The apparatus of claim 20, wherein the third voltage corresponds to a ground voltage.

23. The apparatus of claim 12, wherein the voltage source is operable to:
generate the voltage applied to the gate portion of the second transistor based at least in part on a level of a voltage provided to the apparatus, a temperature of the apparatus, or a combination thereof.

24. The apparatus of claim 1, wherein the circuitry is operable to:
generate the second voltage with a level that is based at least in part on an operating condition of the apparatus.

25. The method of claim 6, further comprising:
generating the first voltage with a level that is based at least in part on an operating condition of a memory device that includes the memory cell.

* * * * *